United States Patent
Usami

(10) Patent No.: US 8,748,314 B2
(45) Date of Patent: Jun. 10, 2014

(54) METHOD OF MANUFACTURING A SEMICONDUCTOR DEVICE

(75) Inventor: Tatsuya Usami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/013,433

(22) Filed: Jan. 25, 2011

(65) Prior Publication Data

US 2011/0183518 A1 Jul. 28, 2011

(30) Foreign Application Priority Data

Jan. 28, 2010 (JP) ................................. 2010-017245

(51) Int. Cl.
*H01L 21/768* (2006.01)

(52) U.S. Cl.
USPC ........... 438/675; 438/622; 438/634; 438/638; 257/E21.584

(58) Field of Classification Search
USPC ........... 438/675, 622, 638, 634; 257/E21.584
See application file for complete search history.

(56) References Cited

U.S. PATENT DOCUMENTS

| 6,838,300 | B2 | 1/2005 | Jin et al. |
| 7,176,126 | B2 | 2/2007 | Oh et al. |
| 2006/0024948 | A1* | 2/2006 | Oh et al. ........................ 438/622 |
| 2009/0170221 | A1* | 7/2009 | Jacques et al. .................... 438/6 |

FOREIGN PATENT DOCUMENTS

| JP | 2002353308 A | 12/2002 |
| JP | 2003338539 A | 11/2003 |
| JP | 2004241776 A | 8/2004 |
| JP | 2006-041519 A | 2/2006 |

OTHER PUBLICATIONS

Cote ("Non-Poisoning Dual Damascene Patterning Scheme for Low-k and Ultralow-k BEOL", Proceedings of 2006 Advanced Metallization Conference, pp. 43-44, Oct. 2006).*

Office Action issued from the Japanese Patent Office dated Dec. 17, 2013 in a counterpart Japanese Patent Application No. 2010-017245.

* cited by examiner

*Primary Examiner* — Minchul Yang
(74) *Attorney, Agent, or Firm* — Sughrue Mion, PLLC

(57) ABSTRACT

There is provided a method of manufacturing a semiconductor device, which includes forming a TiN film as a hard mask directly on a second p-SiCOH film formed on a substrate, forming an opening passing through the TiN film and the second p-SiCOH film by photolithography and etching, cleaning the inside of the opening, removing the TiN film after cleaning the inside, and forming a second metal film filling the opening directly on the second p-SiCOH film after removing the TiN film.

12 Claims, 37 Drawing Sheets

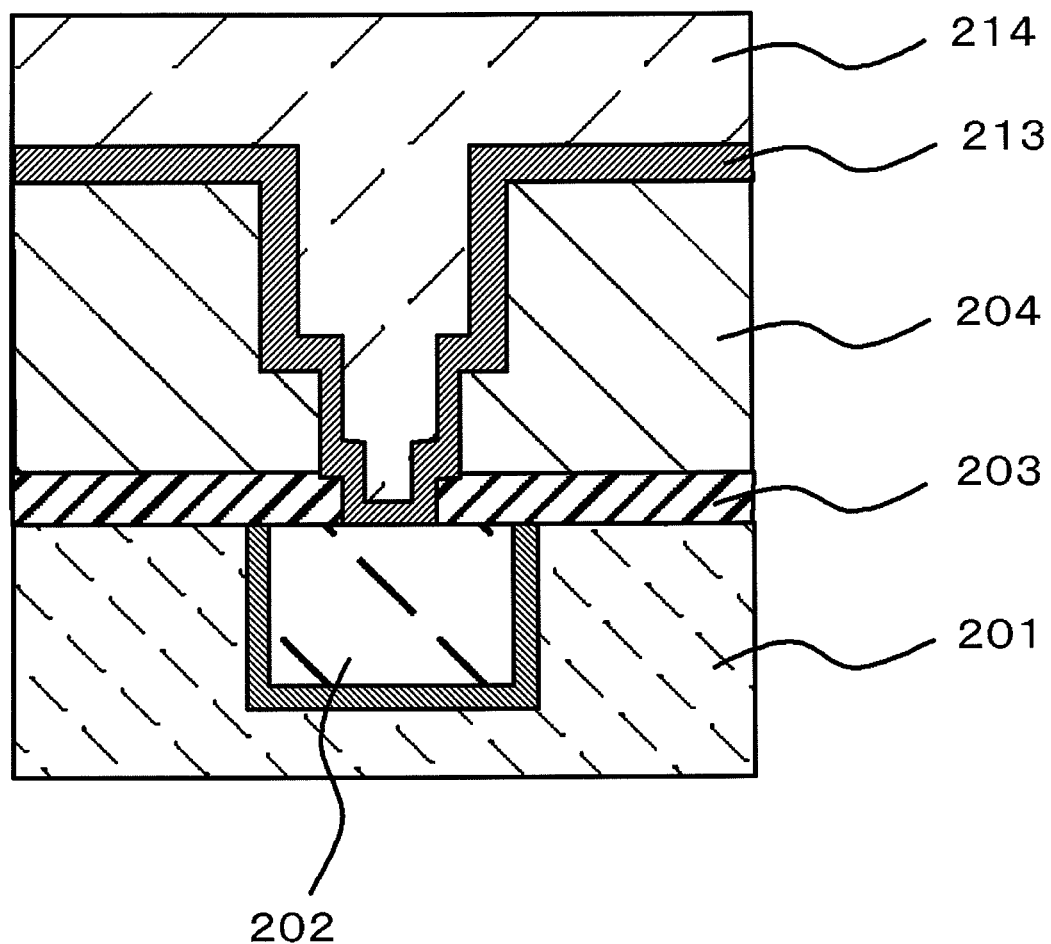

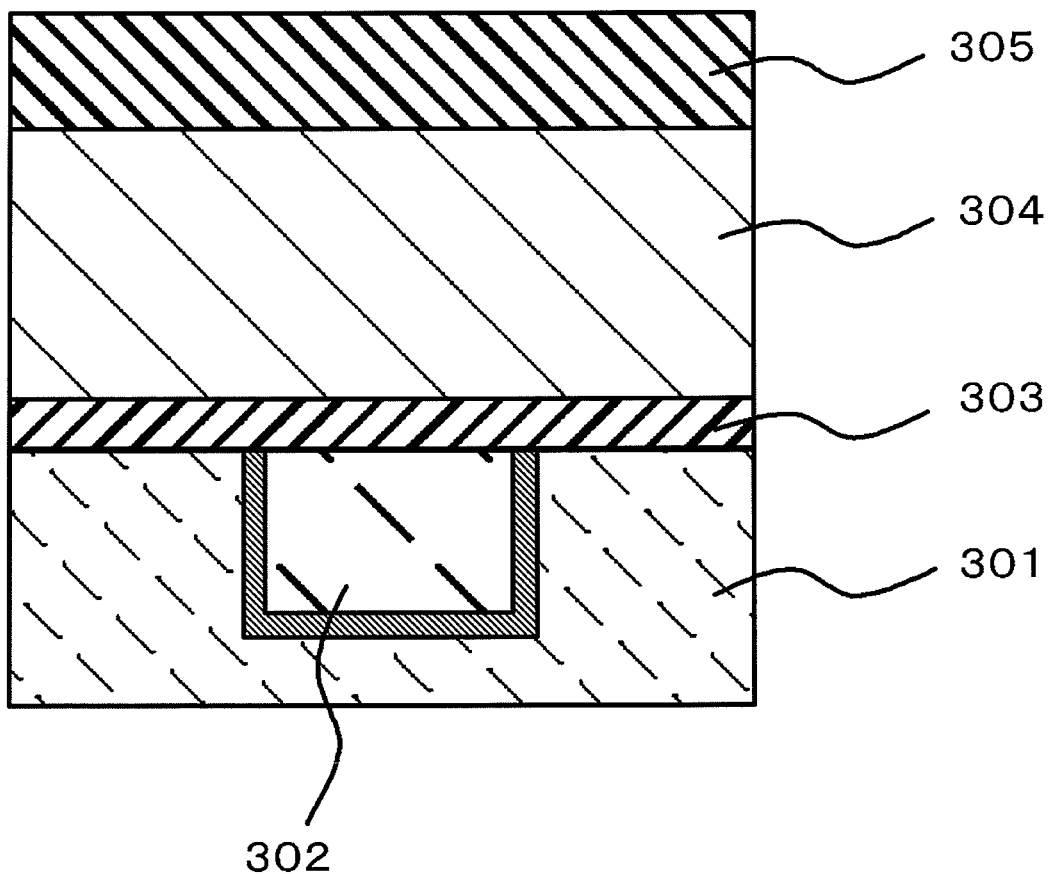

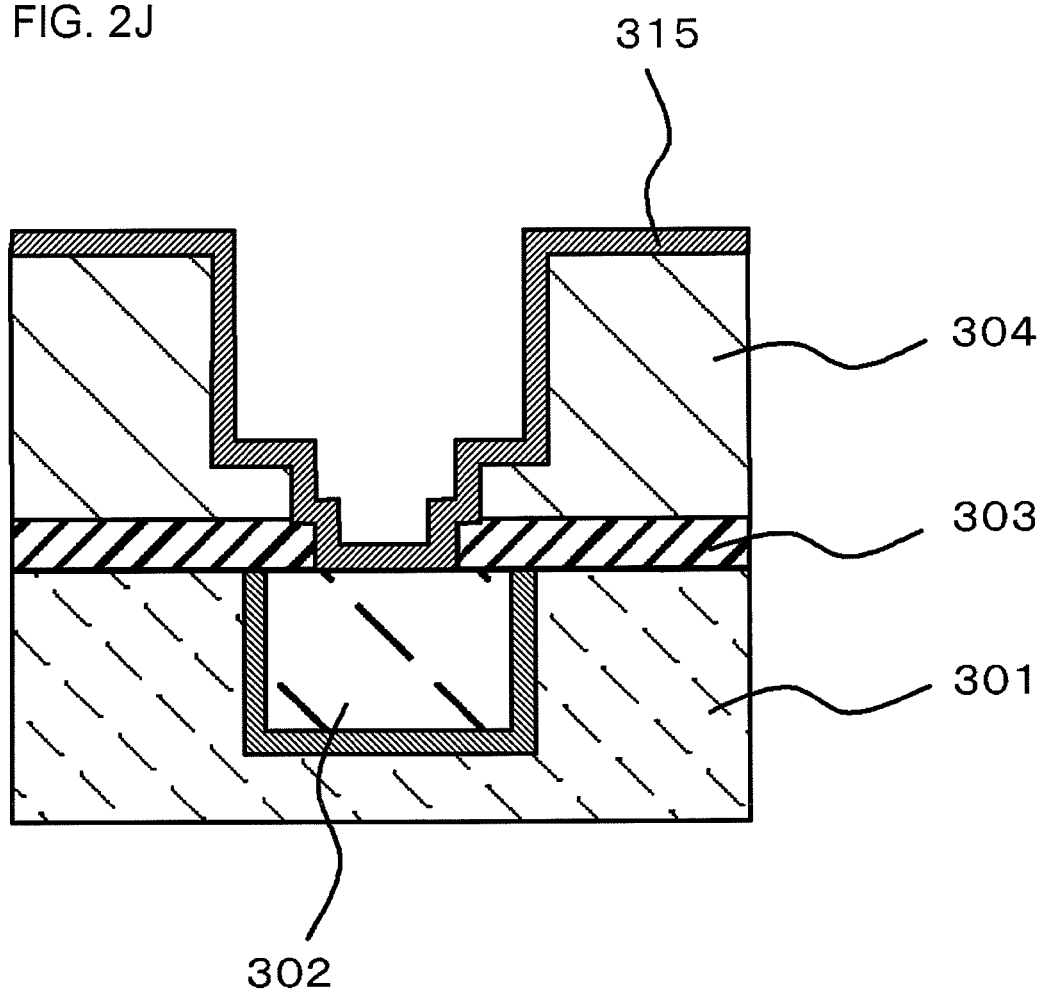

METHOD OF MANUFACTURING A SEMICONDUCTOR DEVICE

This application is based on Japanese patent application NO. 2010-017245, the content of which is incorporated hereinto by reference.

BACKGROUND

1. Technical Field

The present invention relates to a method of manufacturing a semiconductor device.

2. Related Art

A problem of delay of the propagation of signals flowing on a wiring may occur with a miniaturization of large scale integration (LSI) devices. Therefore, in the devices emerged after 28 nm or 32 nm technology, use of a porous SiCOH film (hereinafter, referred to as a "p-SiCOH film") having k (dielectric constant) equal to or less than 2.5 ($k \leq 2.5$) is taken into consideration.

The related art includes techniques disclosed in Japanese laid-open patent publication NO. 2006-041519.

The present inventor has recognized as follows. The problems with the method of manufacturing a semiconductor device will be described with reference to FIGS. 3A to 3L, with an example of a Via-First Dual Damascene process using a p-SiCOH film (where k=2.4). Moreover, the same problems also may occur even when a Trench-First technique is used.

As shown in FIG. 3A, a first Cu wiring 102 is formed using a first p-SiCOH film 101 as an interlayer insulating film, and then a SiCN film 103 and a second p-SiCOH film 104 are sequentially laminated on the first Cu wiring 102.

Next, as shown in FIG. 3B, a $SiO_2$ film 106 serving as a hard mask is formed on the second p-SiCOH film 104. At this time, tetraethoxysilane (TEOS) or $O_2$ is sometimes used as a film forming gas for the $SiO_2$ film 106. In this case, since oxygen is contained in the film forming gas, after the $SiO_2$ film 106 is formed, a damaged layer 105 is produced in a portion of the second p-SiCOH film 104 being in contact with the $SiO_2$ film 106.

Next, as shown in FIG. 3C, a first lower resist layer 107, an anti-reflection film 108, and a first upper resist layer 109 are sequentially formed on the $SiO_2$ film 106, and then the first upper resist layer 109 is patterned into a via pattern by exposure and development. Thereafter, the anti-reflection film 108, the first lower resist layer 107, the $SiO_2$ film 106, and the second p-SiCOH film 104 are etched using the patterned first upper resist layer 109 as a mask to form an opening serving as a via. At this time, part of the damaged layer 105 is also removed. The first upper resist layer 109 and the anti-reflection film 108 masked with the first upper resist layer 109 are also removed. Then, the remaining first lower resist layer 107 is removed by plasma asking and a structure shown in FIG. 3D can be obtained. At this time, a damaged layer 110 is formed on the sidewall of the opening, that is, on the exposed surface of the second p-SiCOH film 104.

Next, as shown in FIG. 3E, a second lower resist layer 111 is formed on the $SiO_2$ film 106 to bury the opening serving as a via. Then, a low-temperature oxide (LTO) film 112, a second anti-reflection film 119, and a second upper resist layer 113 are sequentially formed on the second lower resist layer 111, and then the second upper resist layer 113 is patterned into a trench pattern serving as a wiring by exposure and development. Thereafter, by using the patterned second upper resist layer 113 as a mask, the second anti-reflection film 119, the LTO film 112, the second lower resist layer 111, the $SiO_2$ film 106, and the second p-SiCOH film 104 are etched up to about 50% of the depth of the second p-SiCOH film 104. At this time, parts of the damaged layers 105 and 110 are also removed. Moreover, the second upper resist layer 113, the second anti-reflection film 119 masked with the second upper resist layer 113, and the LTO film 112 are also removed. Then, the remaining second lower resist layer 111 is removed by plasma ashing and a structure shown in FIG. 3F can be obtained. At this time, the damaged layer 110 is formed on the sidewall of the opening, that is, on the exposed surface of the second p-SiCOH film 104.

Thereafter, the opening formed through the above process is buried with metal to form the via hole and the wiring. However, when the opening is buried with the metal in a state where the damaged layer 110 formed on the sidewall of the opening remains, a dielectric constant increases and thus a problem occurs in that a desired inter-wiring capacitance may not be obtained. Accordingly, it is necessary to perform a process of removing the damaged layer 110 by pre-treatment of the burying of the metal. This process is performed with a cleaning liquid, such as diluted-HF (DHF), containing hydrofluoric acid. Since the damaged layer 110 on the sidewall of the opening can be removed in this process, a structure shown in FIG. 3H can be obtained.

In the structure shown in FIG. 3H, step portions are formed between the $SiO_2$ film 106 and the underlying layer thereof due to an etching rate difference (the etching rate of the damage layer 110 is much higher than that of the $SiO_2$ film 106) between the $SiO_2$ film 106 and the damaged layer 110 in the cleaning process. That is, overhang portions A are formed by the $SiO_2$ film 106. When such overhang portions A are formed, the following problems may occur in the subsequent processes.

First, as shown in FIG. 3H, a barrier metal 114 is formed along the sidewall of the opening after the damaged layer 110 is removed. However, when there are the overhang portions A, as shown in FIG. 3I, a problem may arise in that the barrier metal 114 may not be sufficiently formed near the overhang portions A.

By forming Cu seed through a sputtering method after the formation of the barrier metal 114 and then forming a Cu-plated film by a plating method, a Cu film 115 is formed to fill the opening. However, when there are the overhang portions A, as shown in FIG. 3J, a problem may arise in that the opening may not be completely filled with the Cu film 115 and a void 116 may be generated. Moreover, it is considered that the void 116 is generated due to the high aspect ratio of the opening.

A problem may arise in that Cu may be released toward the $SiO_2$ film 106 and the second p-SiCOH film 104, and thus a Cu-escaped portion 117 may be generated after the heat treatment of the Cu plating (see FIG. 3K).

As a consequence, a chemical mechanical polishing (CMP) treatment is performed, and then a slit 118 may be formed due to the void 116, as shown in FIG. 3L. Moreover, a problem that the Cu-escaped portion 117 remains may arise.

In order to resolve the above-mentioned problems, use of a process of removing the $SiO_2$ film 106 (hard mask) before the metal is buried in the opening may be taken into consideration. According to this process, the removal of the overhang portions A and improvement in the aspect ratio of the opening can be realized.

However, the inventors have found that a new problem occurs. When the damaged layer 105 is produced in the portion of the second p-SiCOH film 104 being in contact with the $SiO_2$ film 106, as described above, the exposed surface becomes uneven after the removal of the $SiO_2$ film 106 and thus the surface area increases. That is, a structure in which the second p-SiCOH film 104 easily absorbs moisture in the air may be formed. In this case, the second p-SiCOH film 104 absorbs much moisture (moisture or the like in the air) when the $SiO_2$ film 106 is removed in the early stage of the manufacturing procedure.

Also the inventors have found that in the above method of manufacturing a semiconductor device, other following problems may occur.

That is, in the process of cleaning the inside of the opening after the structure in FIG. 3H is obtained, partially or entirely the damage layer 105 formed in the contact portion of the second p-SiCOH film 104, the portion being in contact with the $SiO_2$ film 106, may be removed (see FIG. 3G).

In this case, partially or entirely the $SiO_2$ film 106 is removed by lift-off. As a consequence, a problem may arise in that the second p-SiCOH film 104 absorbs much of the cleaning liquid due to an increase in the surface area of the second p-SiCOH film 104 being in contact with the cleaning liquid. Moreover, a problem may arise in that the removed $SiO_2$ film 106 is attached to an unintended portion on the semiconductor device.

SUMMARY

In one embodiment, there is provided a method of manufacturing a semiconductor device, including forming a first metal film or a silicon film as a hard mask directly on a low dielectric constant insulating film having a lower dielectric constant than that of a silicon oxide formed on a substrate, forming an opening passing through the hard mask and the low dielectric constant insulating film by photolithography and etching, cleaning the inside of the opening, removing the hard mask after the cleaning the inside, and forming a second metal film to fill the opening directly on the low dielectric constant insulating film after the removing the hard mask.

In the method of manufacturing a semiconductor device according to the invention, the first metal film or the silicon film having no oxygen in the composition thereof is formed directly on the low dielectric constant insulating film as a hard mask. Therefore, the damaged layer resulting from the hard mask forming process is prevented from being formed in a portion of the low dielectric constant insulating film, the portion being in contact with the hard mask.

In this case, although the hard mask is removed in a relatively early stage of the manufacturing procedure, there is nearly no likelihood that the low dielectric constant insulating film absorbs a lot of moisture (moisture or the like in the air). That is, it can be allowed the hard mask is removed before metal is buried in the opening serving as a via or the like.

In the method of manufacturing the semiconductor device according to the invention, as described above, it can be allowed that the hard mask is removed before metal is buried in the opening serving as a via or the like. Therefore, the overhang portions can be removed before the process of burying the metal in the opening. Moreover, an aspect ratio of the opening can be reduced by the removal of the hard mask.

As a consequence, a void can be prevented from being formed in the metal buried in the opening. After the heat treatment of the Cu plating, Cu can be prevented from being released toward the low dielectric constant insulating film, and thus a Cu-escaped portion can be prevented from being formed.

According to the invention, a void can be prevented from being formed when metal is buried in an opening serving as a via or the like.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 1L are sectional views schematically showing a manufacturing process of an exemplary method of manufacturing a semiconductor device according to a first embodiment;

FIGS. 2A to 2M are sectional views schematically showing a manufacturing process of an exemplary method of manufacturing a semiconductor device according to a second embodiment;

DETAILED DESCRIPTION

Figure 1A:
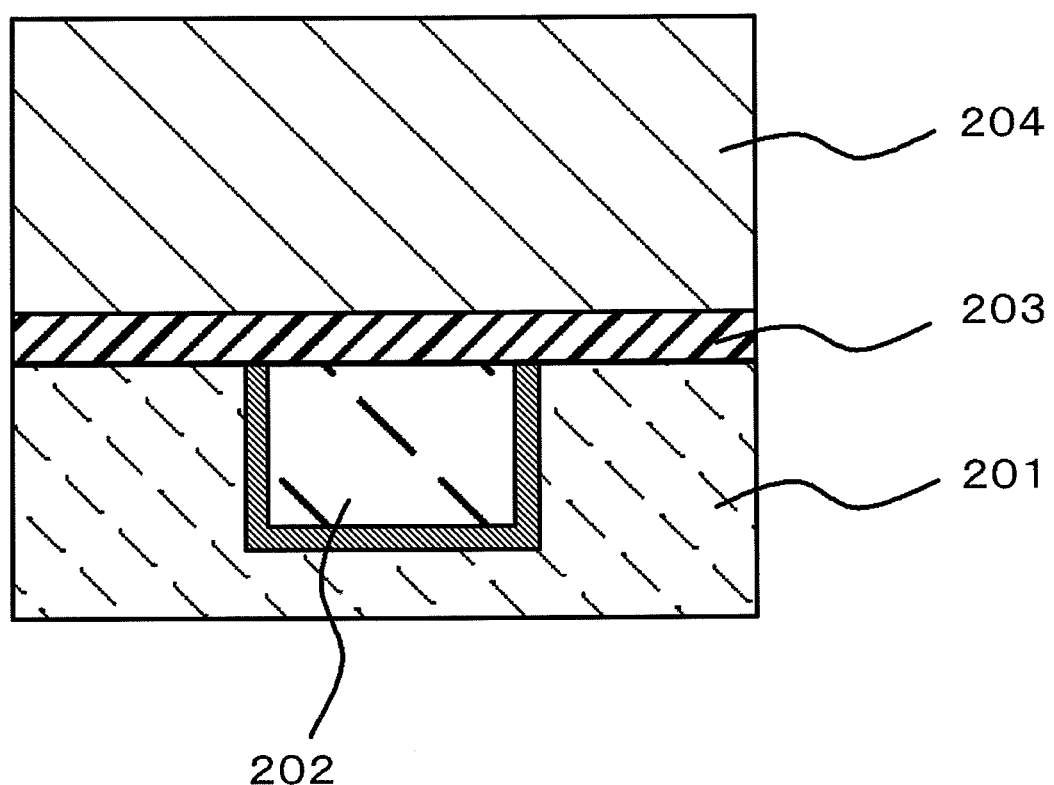

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the drawings. In all the drawings, the same reference numerals are given to the same elements and the description thereof will not be repeated.

First Embodiment

FIGS. 1A to 1L are sectional views showing an exemplary method of manufacturing a semiconductor device according to this embodiment. Hereinafter, the exemplary method of manufacturing the semiconductor device according to this embodiment will be described with reference to FIGS. 1A to 1L.

(1) Process of Forming Hard Mask

A first metal film or a silicon film is first formed as a hard mask directly on a low dielectric constant insulating film formed on a substrate.

For example, as shown in FIG. 1A, a first Cu wiring 202 is formed on the substrate (not shown) using a first p-SiCOH film 201 as an interlayer insulating film, and then a first SiCN film 203 (for example, with a film thickness of 30 nm) is formed on the first Cu wiring 202. Thereafter, a second p-SiCOH film 204 (for example, with a film thickness of 200 nm) is formed on the first SiCN film 203.

Instead of the second p-SiCOH film 204, other low dielectric constant insulating films may be applied. A low dielectric constant insulating film refers to an insulating film with a dielectric constant lower than that of silicon oxide. Examples of the low dielectric constant insulating film include a SiCOH film, a hydrogen silsesquioxane (HSQ) film, a methyl silsesquioxane (MSQ) film, an organic polymer, a porous HSQ film, a porous MSQ film, and other porous insulating films.

Figure 1B:
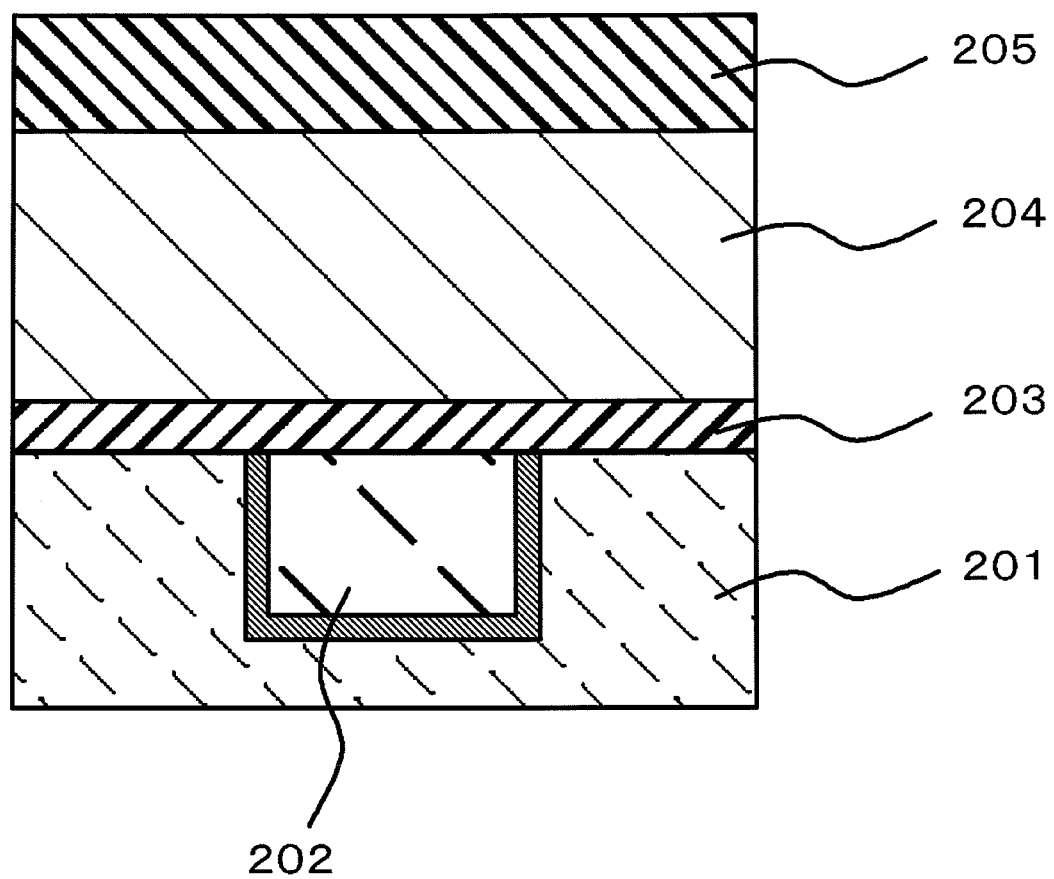

Next, for example, as shown in FIG. 1B, a TiN film (hard mask) 205 (for example, with a film thickness of 20 nm) is formed directly on the second p-SiCOH film 204 (low dielectric constant insulating film) using a sputtering method. As a hard mask, not only the TiN film 205 but also a film made of any one of Ti, W, WN, WSi, Al, AlN, Ta, TaN, Ru, RuN, Co, CoN, Si, Cr, and CrN may be used or a silicon film may be used. When any one of these films is used as the hard mask, since no oxygen is contained in the composition of these films, a damaged layer resulting from the hard mask forming process can be prevented from being formed in a portion of the low dielectric constant insulating film (for example, the second p-SiCOH film 204), the portion being in contact with the hard mask.

(2) Process of Forming Opening

After the hard mask is formed, an opening is formed to pass through the hard mask and the low dielectric constant insulating film by photolithography and etching.

Figure 1C:
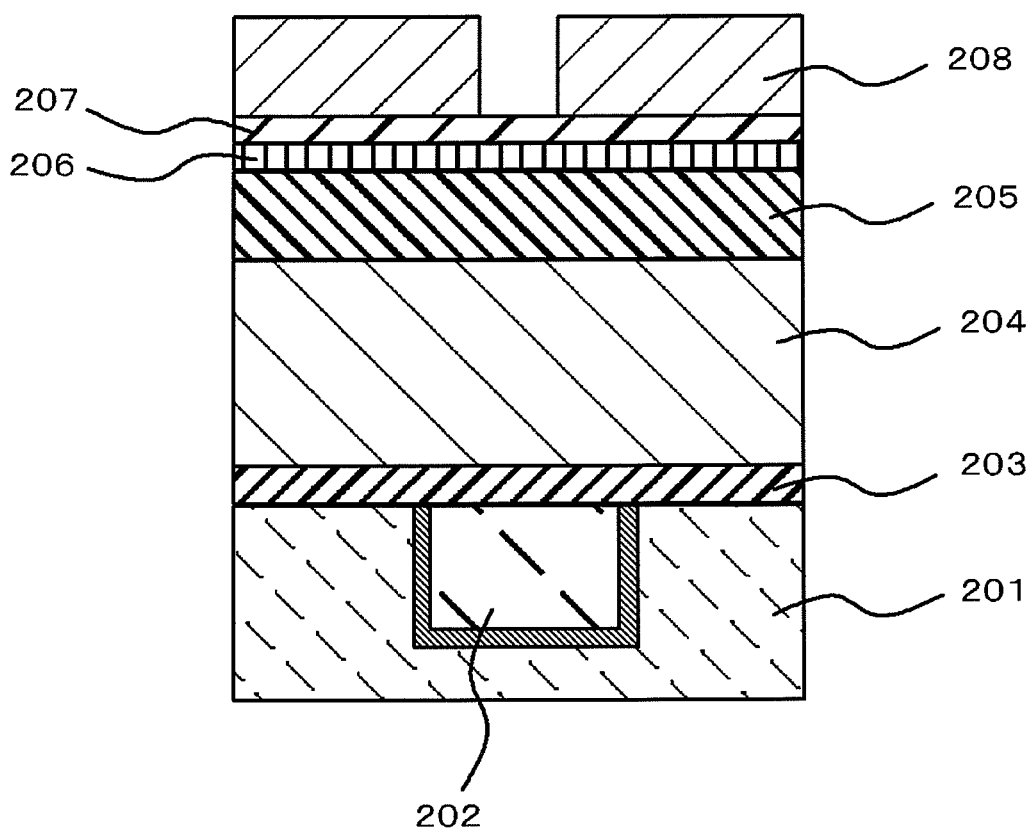

For example, as shown in FIG. 1C, a first lower resist layer 206, an anti-reflection film 207, and a first upper resist layer 208 are sequentially formed on the TiN film 205, and then the first upper resist layer 208 is patterned into a via pattern by exposure and development. Thereafter, the anti-reflection film 207, the first lower resist layer 206, the TiN film 205, and the second p-SiCOH film 204 are etched using the patterned first upper resist layer 208 as a mask to form an opening serving as a via. The first upper resist layer 208 and the anti-reflection film 207 masked with the first upper resist layer 208 are removed by this process.

Figure 1D:
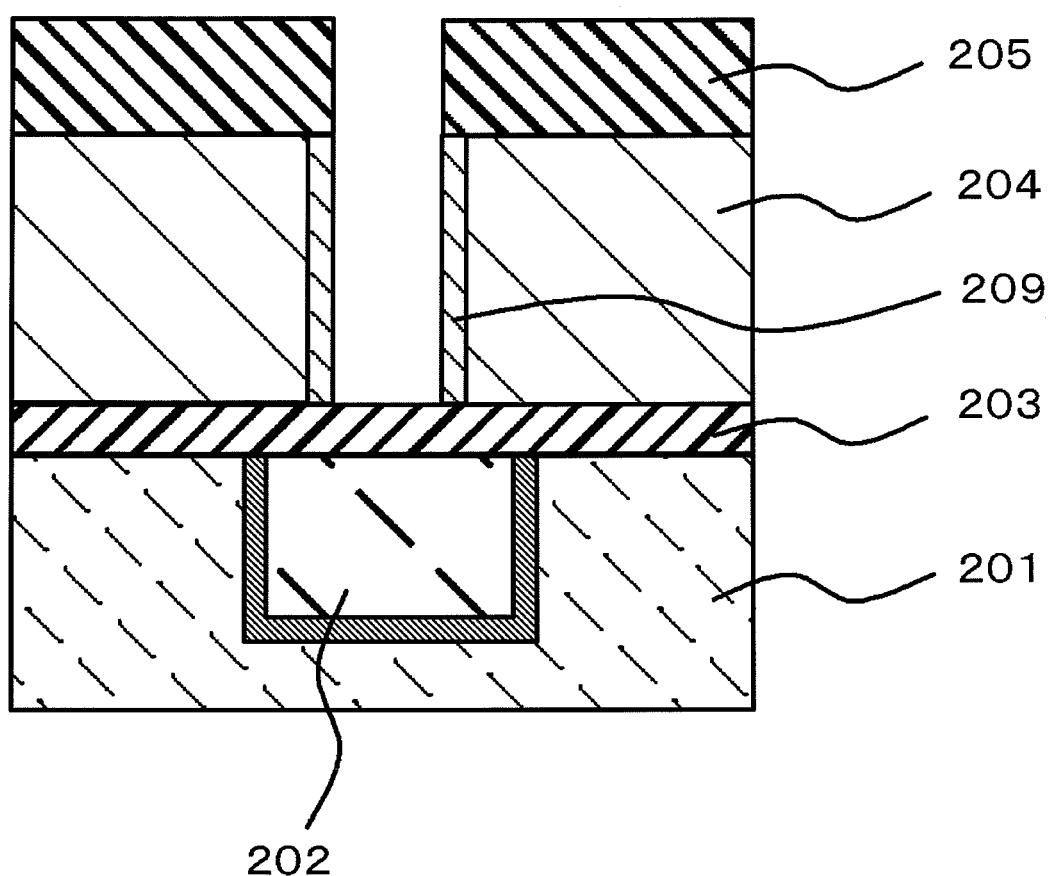

Thereafter, a structure shown in FIG. 1D can be obtained when the remaining first lower resist layer 206 is removed by plasma ashing. At this instance, a damaged layer 209 is formed on the sidewall of the opening, that is, on the exposed surface of the second p-SiCOH film 204.

Then, photolithography may be performed on a trench pattern which serves as a second wiring through a multi-layered resist method.

Figure 1E:
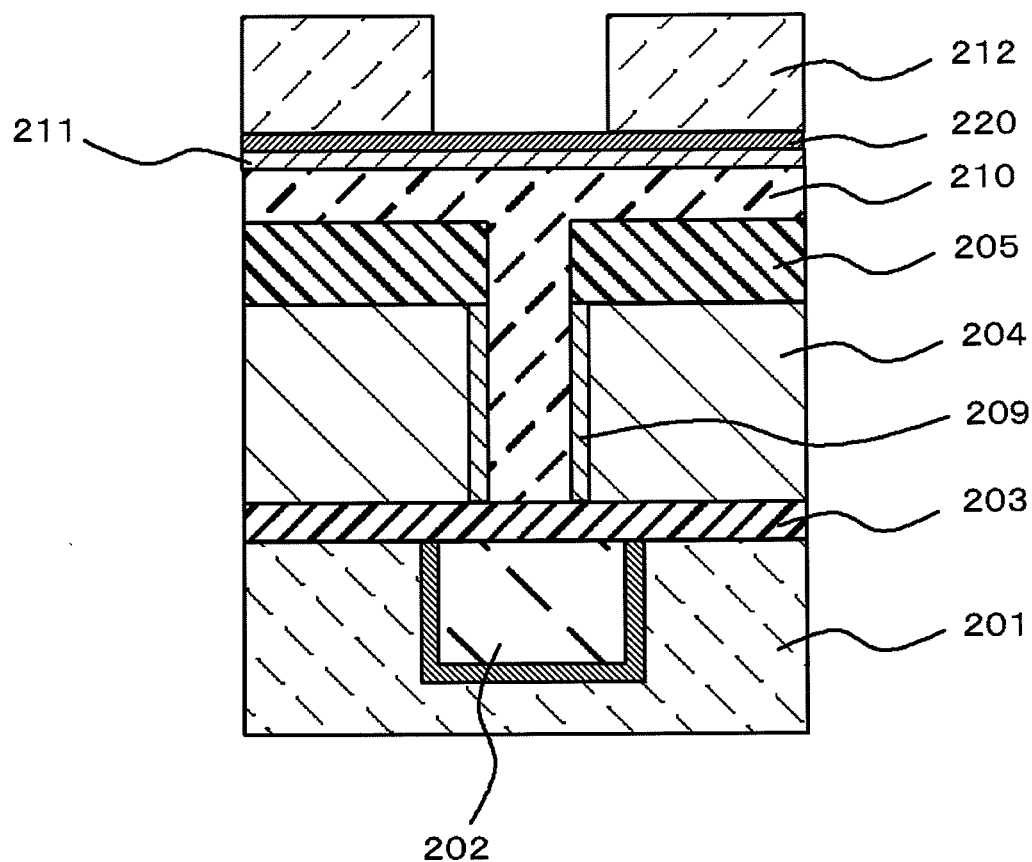
Figure 1F:
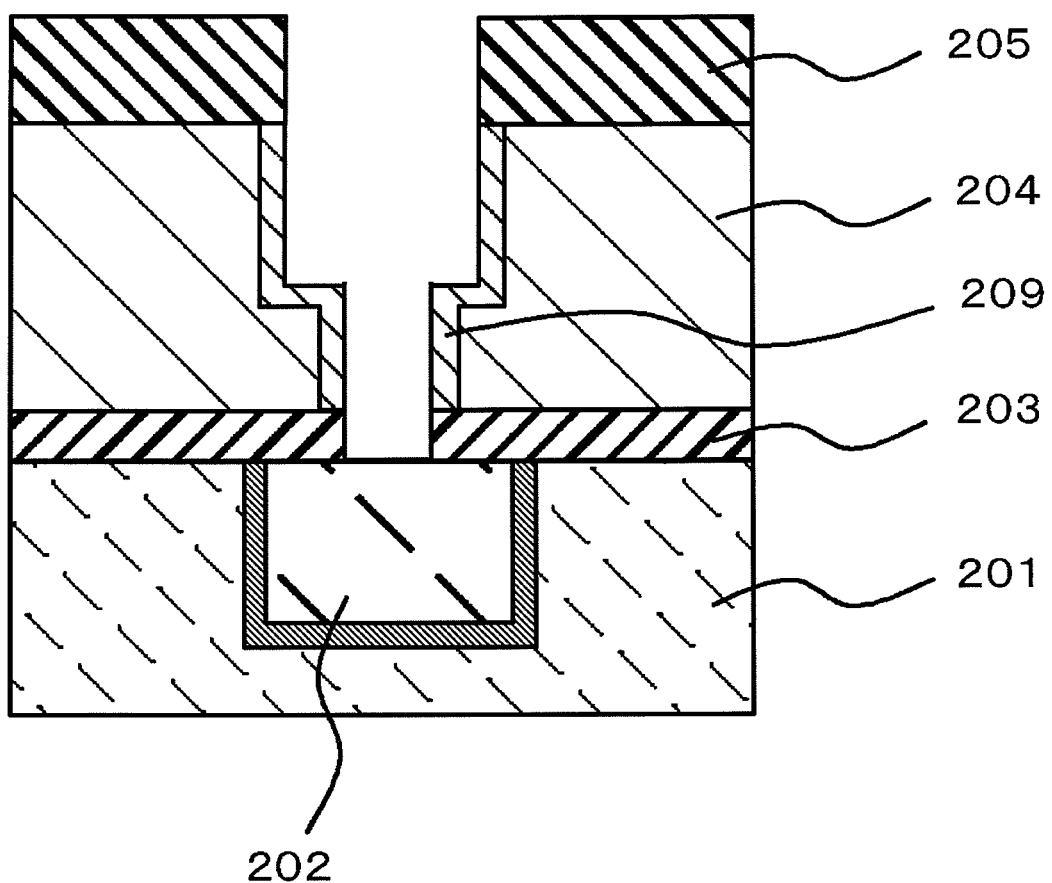

For example, as shown in FIG. 1E, a second lower resist layer 210 is formed on the TiN film 205 to fill the opening passing through the second p-SiCOH film 204 and the TiN film 205. Then, an LTO film 211, a second anti-reflection film 220, and a second upper resist layer 212 are sequentially formed on the second lower resist layer 210, and then the second upper resist layer 212 is patterned into a trench pattern serving as a second wiring by exposure and development. Thereafter, by using the patterned second upper resist layer 212 as a mask, the second anti-reflection film 220, the LTO film 211, the second lower resist layer 210, the TiN film 205, and the second p-SiCOH film 204 are etched up to about 50% of the depth of the second p-SiCOH film 204. Openings such as the opening serving as the via and the trench serving as the second wiring can be formed by this etching. By this process of forming the openings, the second upper resist layer 212 is removed and the second anti-reflection film 220 and the LTO film 211 masked with the second upper resist layer 212 are removed. Then, a structure shown in FIG. 1F can be obtained when the remaining second lower resist layer 210 is removed by plasma asking. At this instance, the damaged layer 209 is formed on the sidewall of the opening, that is, on the exposed surface of the second p-SiCOH film 204.

(3) Cleaning Process

The process of forming the opening is followed by cleaning the inside of the opening.

That is, the damaged layer 209 formed on the sidewall of the opening is removed by the cleaning of the inside of the opening. For example DHF or buffered-HF (BHF), containing hydrofluoric acid therein can be used as a cleaning liquid in the cleaning process. Besides, sulfuric acid or hydrochloric acid may be used as the cleaning liquid. When any one of the above cleaning liquids is selected, the damaged layer 209 can be sufficiently removed and it is possible to prevent dielectric constant from increasing.

Figure 1G:
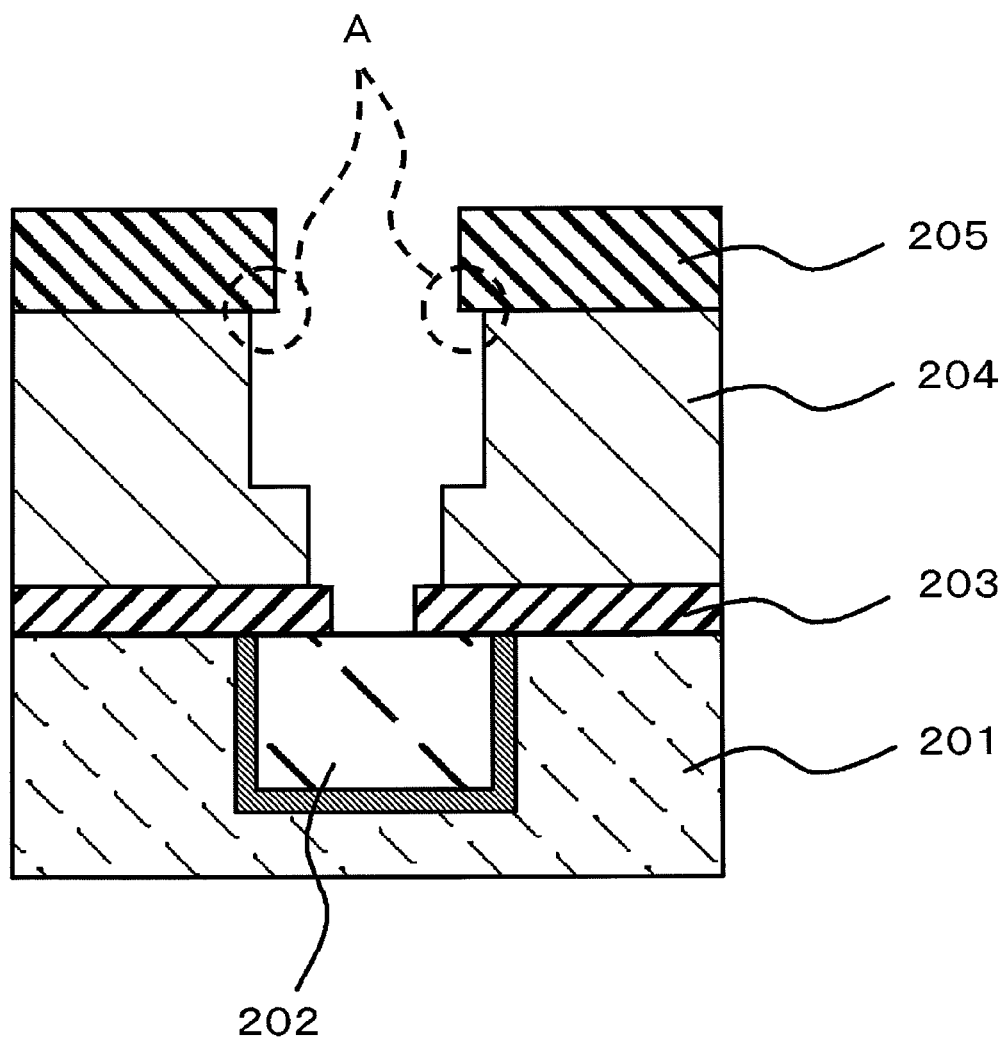
Figure 1H:
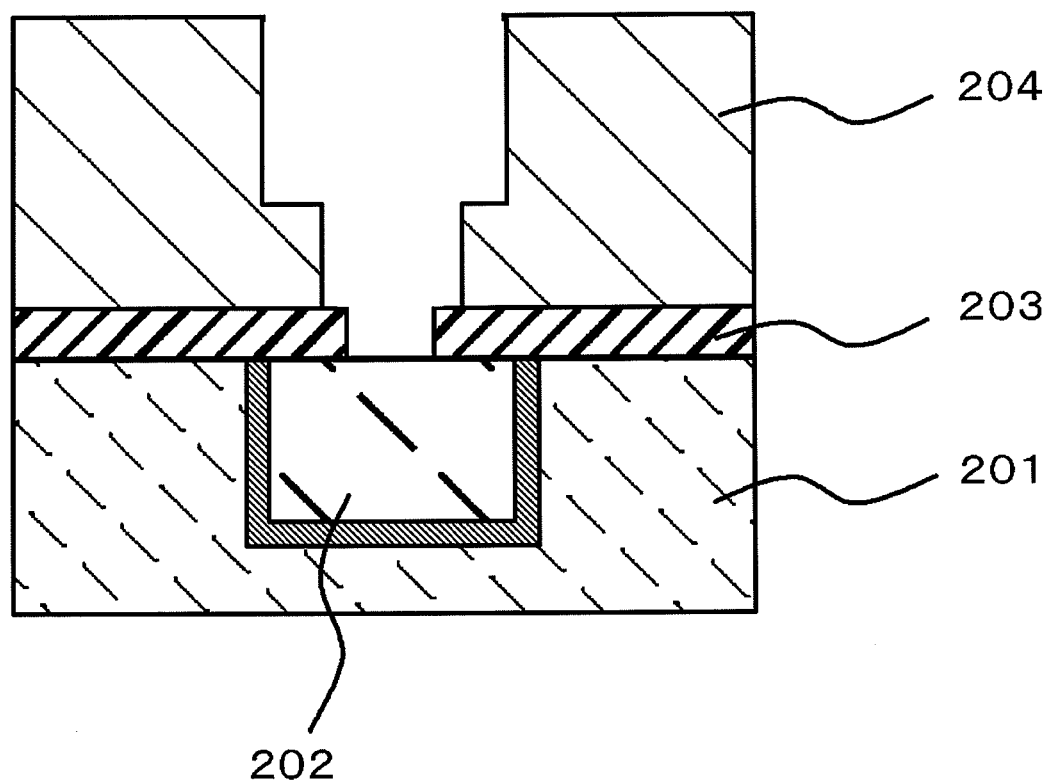

After the cleaning process, as shown in FIG. 1G, step portions are formed between the TiN film 205 and the underlying layer thereof due to an etching rate difference (since the etching rate of the damage layer 209 is much higher than that of the TiN film 205) between the TiN film 205 and the damage layer 209 in the cleaning process. That is, overhang portions A are formed by the TiN film 205. Moreover, the overhang portions A are also formed even when a hard mask made of a material other than the above-described material is used instead of the TiN film 205.

(4) Process of Removing Hard Mask

After the cleaning process, the hard mask is removed.

For example, after a structure shown in FIG. 1G is obtained, the TiN film 205 is removed using a cleaning liquid containing DHF therein by performing a wet etching process for a long period of time. The method of removing the hard mask is not particularly limited, but various methods can be selected depending on the kind of hard masks. By performing the process of removing the hard mask, a structure shown in FIG. 1H can be obtained.

In this embodiment, since no damaged layer is produced in the portion of the second p-SiCOH film 204, the portion being in contact with the TiN film 205, the exposed surface does not become uneven after the removal of the TiN film 205. Therefore, there is no likelihood that the second p-SiCOH film 204 absorbs much moisture in the air.

(5) Process of Forming Metal Film

After the process of removing the hard mask, a second metal film filling the opening is formed directly on the low dielectric constant insulating film.

Figure 1I:
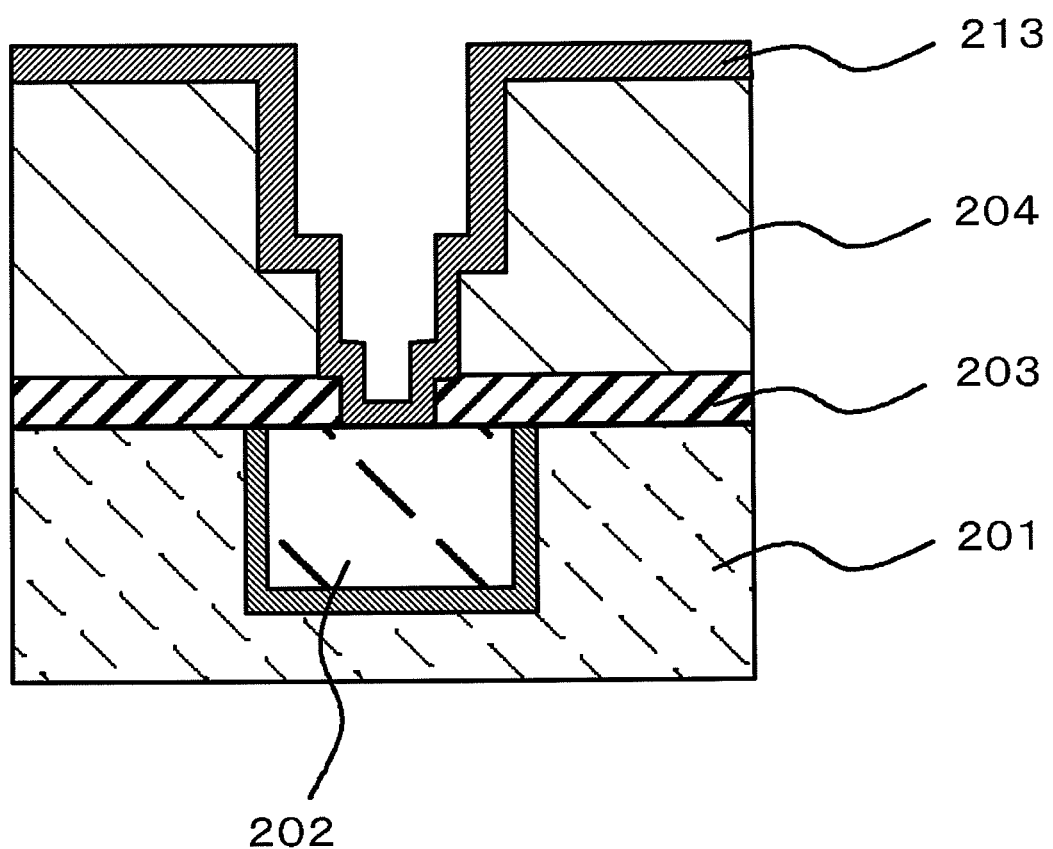
Figure 1K:
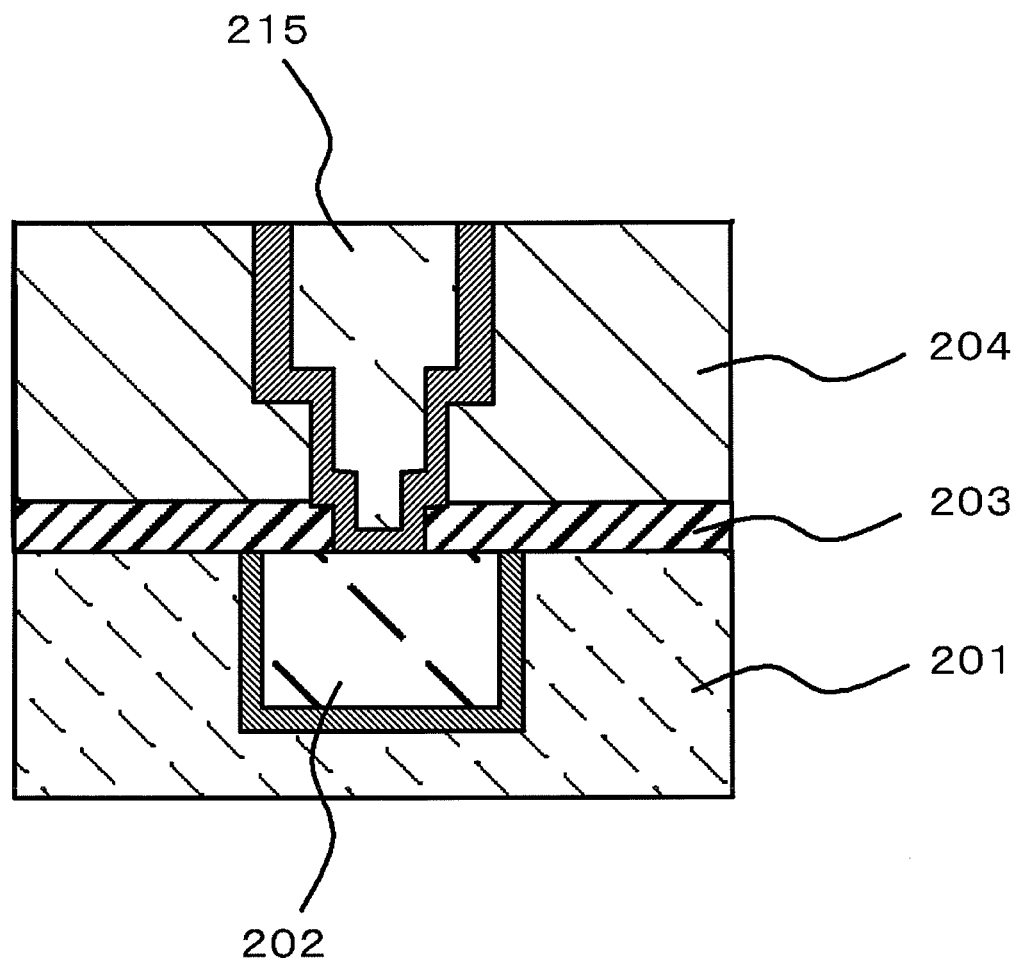

For example, as shown in FIG. 1I, Ta (upper layer)/TaN (lower layer) (for example, with a total film thickness of 15 nm) as a barrier metal 213 is first formed by a sputtering method. Next, as shown in FIG. 1J, a Cu film 214 is formed through a method in which a Cu seed (for example, with a film thickness of 40 nm) is formed by sputtering onto the barrier metal 213 and then a Cu-plated film (for example, with a film thickness of 300 nm) is formed by a plating method. Then, heat treatment is performed at 300° C. for 30 minutes in a nitrogen atmosphere. Next, as shown in FIG. 1K, a structure having a second Cu wiring 215 can be obtained by performing a CMP.

Figure 1L:
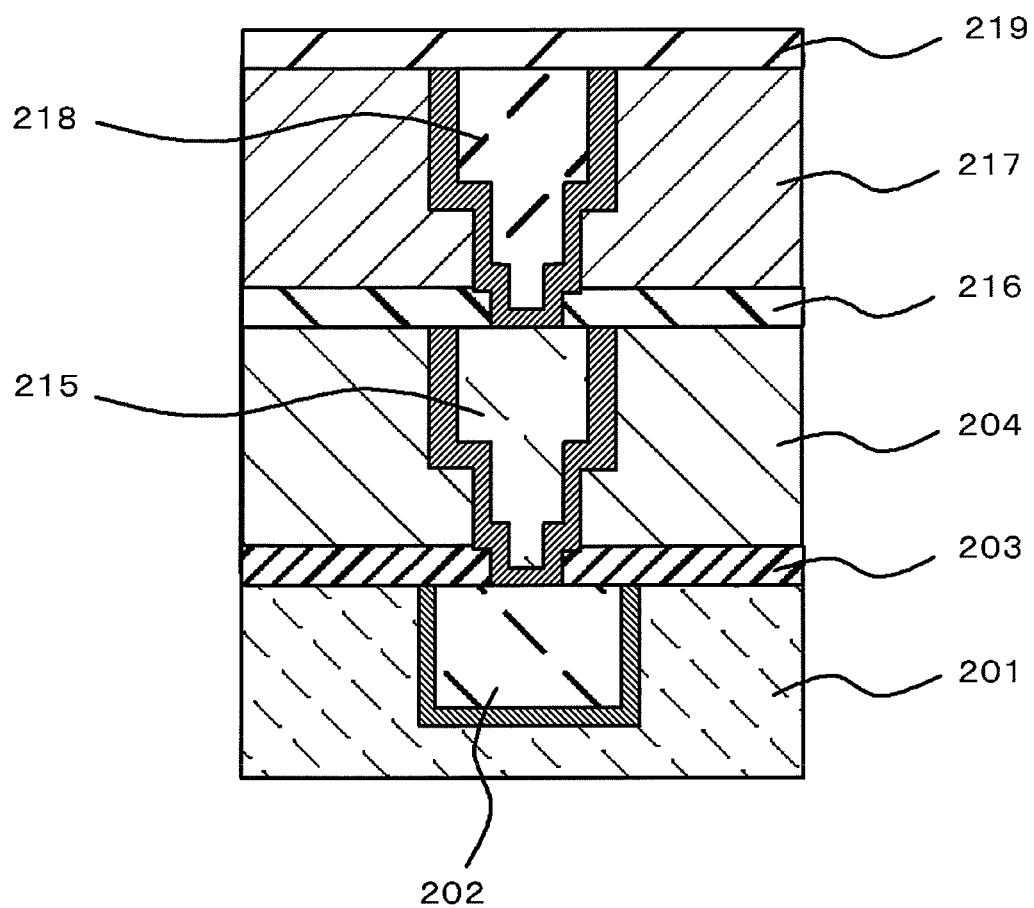

By repeating the above-described processes, a laminate structure shown in FIG. 1L may be formed. The laminate structure with the number of layers equal to or more than that shown in FIG. 1L may be formed.

Next, the operational advantages of the method of manufacturing the semiconductor device according to this embodiment will be described.

In the method of manufacturing the semiconductor device according to this embodiment, the first metal film (for example, the TiN film 205) or the silicon film having no oxygen in the composition thereof, which serves as the hard mask, is formed directly on the low dielectric constant insulating film (for example, the second p-SiCOH film 204). Therefore, due to the process of forming the hard mask, production of the damaged layer in the portion of the low dielectric constant insulating film (for example, the second p-SiCOH film 204) being in contact with the hard mask (for example, the TiN film 205) is prevented.

In this case, although the hard mask is removed in the relatively early stage of the manufacturing procedure, there is nearly no likelihood that the low dielectric constant insulating film absorbs much moisture (moisture or the like in the air). That is, it can be allowed that the hard mask is removed before metal is buried in the opening serving as a via or the like.

In the method of manufacturing the semiconductor device according to this embodiment, as described above, the hard mask can be removed before the metal is buried in the opening serving as a via or the like. Therefore, the overhang portions (see FIG. 1G) can be removed before the process of burying the metal in the opening is performed. Moreover, an aspect ratio of the opening can be reduced by the removal of the hard mask.

As a consequence, a void can be prevented from being generated in the metal buried in the opening. After the heat treatment of the Cu plating, Cu can be prevented from being released toward the low dielectric constant insulating film and Cu can be prevented from being escaped.

Moreover, in the method of manufacturing the semiconductor device according to this embodiment, as described above, the damaged layer is prevented from being produced in the portion of the low dielectric constant insulating film (for example, the second p-SiCOH film 204), the portion being in contact with the hard mask (for example, the TiN film 205). Therefore, the following advantages can be obtained.

That is, in the cleaning process of removing the damaged layer (for example, the damaged layer 209 shown in FIG. 1F) formed on the sidewall of the opening in which the metal is to be buried, although the cleaning process of sufficiently removing the damaged layer is performed using the cleaning liquid containing hydrofluoric acid therein, there is nearly no likelihood that partially or entirely the hard mask is removed unintentionally. Accordingly, since the damaged layer formed on the sidewall of the opening can be sufficiently removed, it is possible to resolve the problem that the dielectric constant increases due to the damaged layer and thus a desired inter-wiring capacitance may not be obtained.

Second Embodiment

In the first embodiment, an example of the via-first method has been described. In this embodiment, an example of the trench-first method will be described.

Hereinafter, an exemplary method of manufacturing a semiconductor device according to this embodiment will be described with reference to FIGS. 2A to 2M. FIGS. 2A to 2M are diagrams illustrating an exemplary method of manufacturing a semiconductor device according to this embodiment.

(1) Process of Forming Hard Mask

A first metal film or a silicon film is first formed as a hard mask directly on a low dielectric constant insulating film formed on a substrate.

Figure 2A:
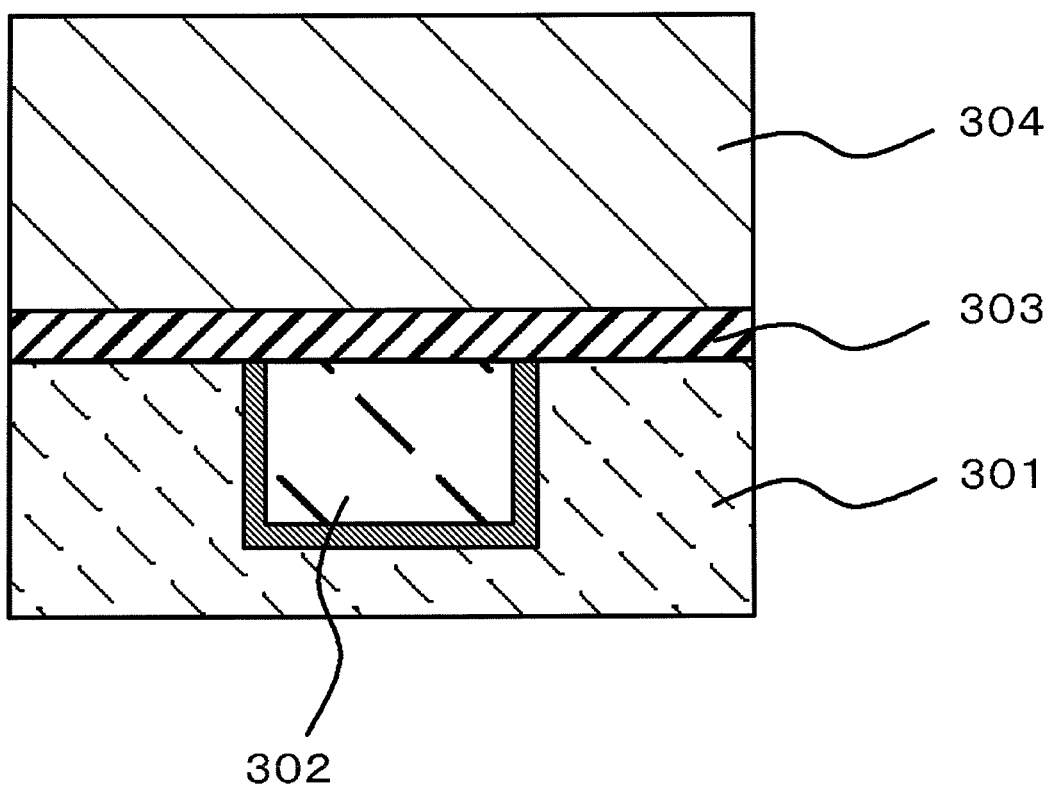

For example, as shown in FIG. 2A, a first Cu wiring 302 is formed on the substrate (not shown) using a first p-SiCOH film 301 as an interlayer insulating film, and then a first SiCN film 303 (for example, with a film thickness of 30 nm) is formed on the first Cu wiring 302. Thereafter, a second p-SiCOH film 304 (for example, with a film thickness of 200 nm) is formed on the first SiCN film 303.

Instead of the second p-SiCOH film 304, other low dielectric constant insulating films may be applied. Examples of the low dielectric constant insulating film include a SiCOH film, a hydrogen silsesquioxane (HSQ) film, a methyl silsesquioxane (MSQ) film, an organic polymer, a porous HSQ film, a porous MSQ film, and other porous insulating films.

Next, as shown in FIG. 2B, a TiN film (hard mask) 305 (for example, with a film thickness of 20 nm) is formed directly on the second p-SiCOH film 304 (low dielectric constant insulating film) using a sputtering method, for example. As a hard mask, not only the TiN film 305 but also a film made of any one of Ti, W, WN, WSi, Al, AlN, Ta, TaN, Ru, RuN, Co, CoN, Si, Cr, and CrN may be used, or a silicon film may be used. When any one of these films is used as the hard mask, since no oxygen is contained in the composition of these films, a damaged layer resulting from the hard mask forming process can be prevented from being formed in a portion of low dielectric constant insulating film (for example, the second p-SiCOH film 304), the portion being in contact with the hard mask.

(2) Process of Forming Opening

After the hard mask is formed, an opening is formed to pass through the hard mask and the low dielectric constant insulating film by photolithography and etching.

For example, after the process of forming the hard mask is performed, a trench pattern is formed in the second p-SiCOH film 304 using a multi-layered resist method.

Figure 2C:
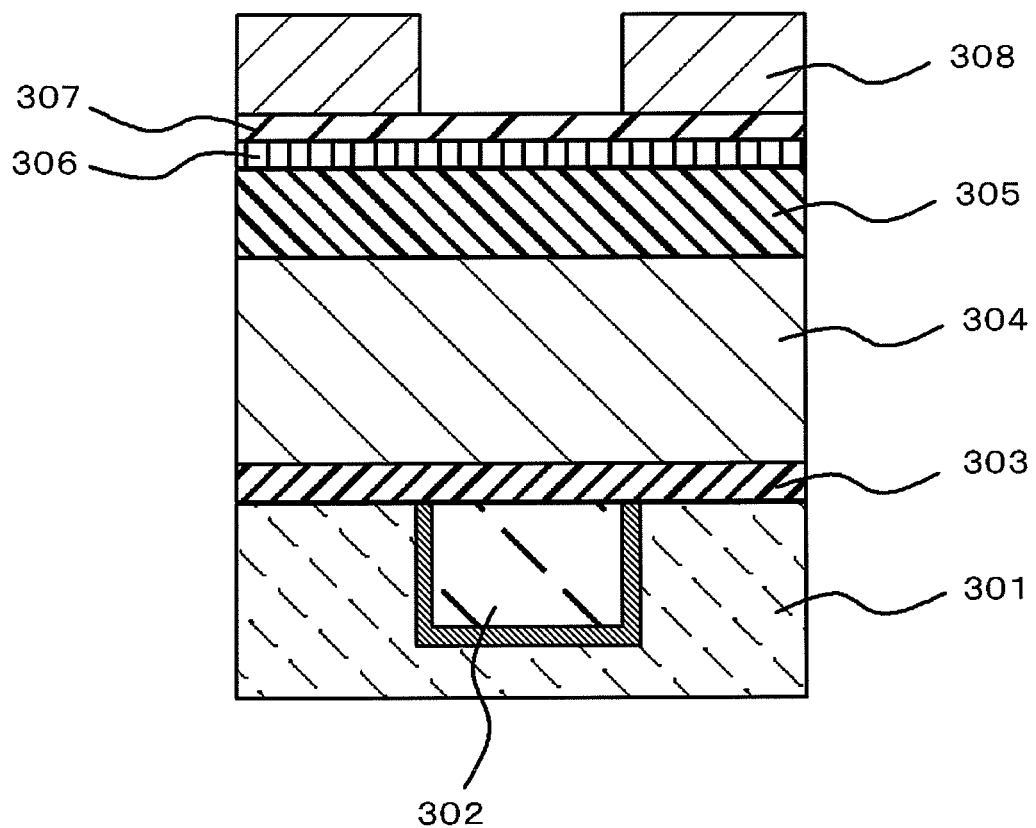

For example, as shown in FIG. 2C, a first lower resist layer 306, a first anti-reflection film 307, and a first upper resist layer 308 are first sequentially formed on the TiN film 305, and then the first upper resist layer 308 is patterned into a trench pattern serving as a second wiring by exposure and development. Thereafter, the TiN film 305 is treated with a chlorine-based etching gas using the patterned first upper resist layer 308 as a mask. The first upper resist layer 308 and the first anti-reflection film 307 masked with the first upper resist layer 308 are removed through this process.

Figure 2D:
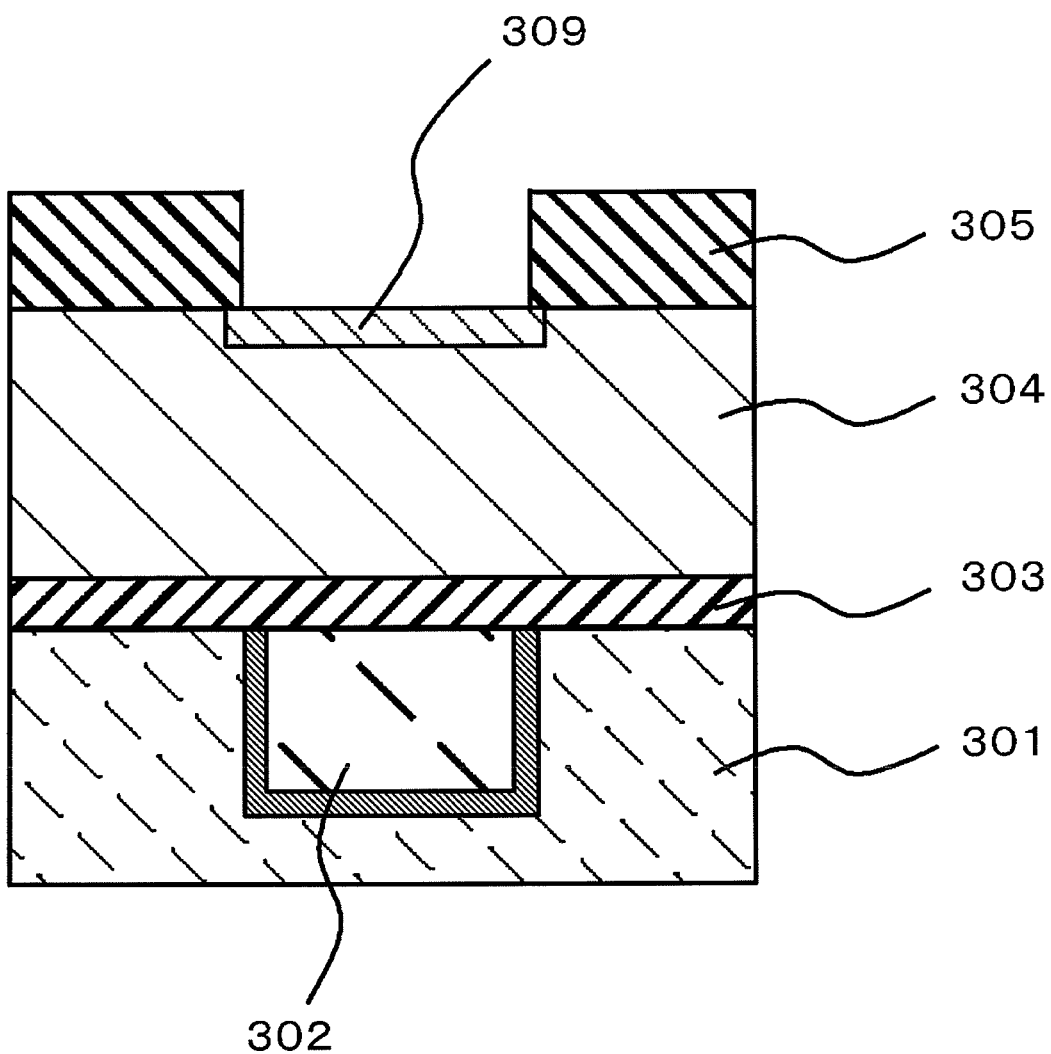

Thereafter, a structure shown in FIG. 2D can be obtained when the remaining first lower resist layer 306 is removed by plasma ashing. At this time, a damaged layer 309 is thinly formed on the exposed surface of the second p-SiCOH film 304 serving as the bottom surface of the opening formed in the TiN film 305.

As described above, the trench pattern is formed in the second p-SiCOH film 304, and then a via pattern is formed in the second p-SiCOH film 304 using, for example, a multi-layered resist method.

Figure 2E:
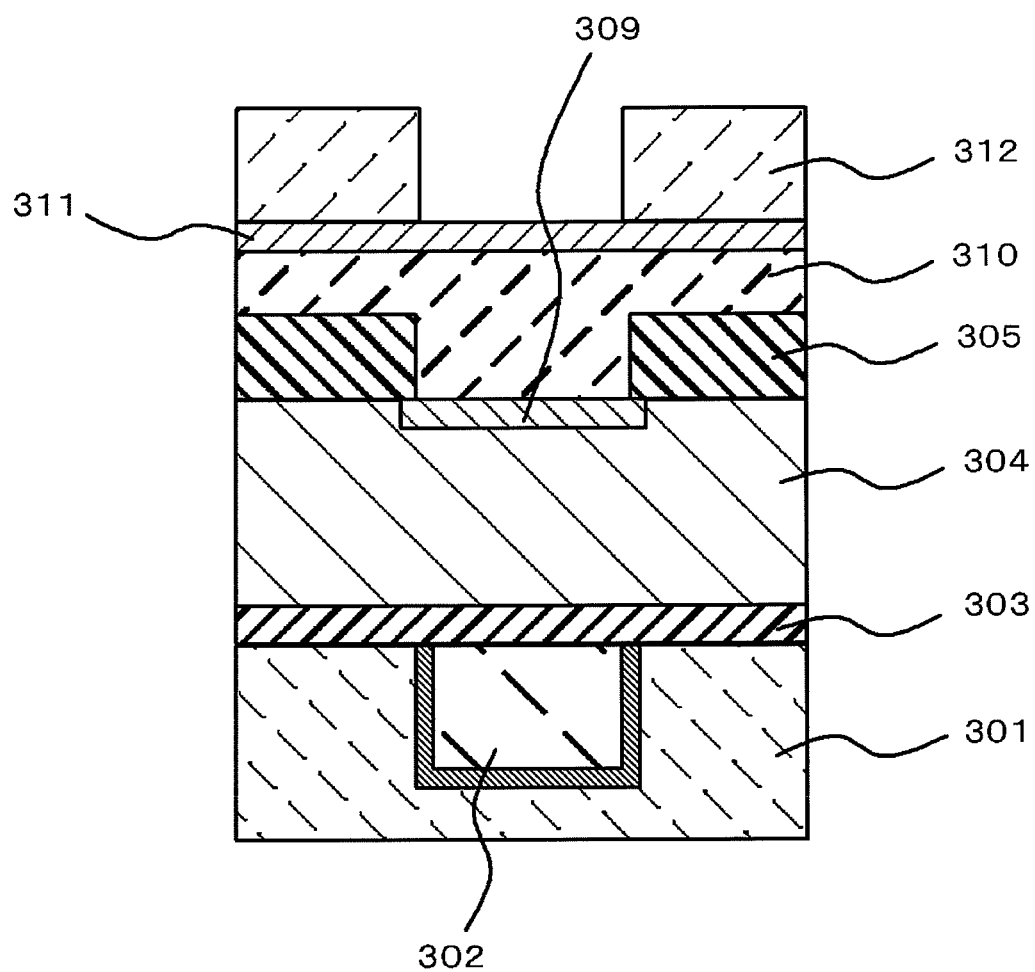

For example, as shown in FIG. 2E, a second lower resist layer 310 is formed on the TiN film 305 to fill the opening formed in the TiN film 305. Then, a second anti-reflection film 311 and a second upper resist layer 312 are sequentially formed on the second lower resist layer 310, and then the second upper resist layer 312 is patterned into a via pattern by exposure and development. Thereafter, by using the patterned second upper resist layer 312 as a mask, the second anti-reflection film 311, the second lower resist layer 310, and the second p-SiCOH film 304 are etched up to about 50% of the depth of the second p-SiCOH film 304. The second p-SiCOH film 304 can be etched using a CF-based etching gas. Openings such as the opening serving as the via and the trench serving as the second wiring can be formed by this etching. At this time, even when part (not shown) of the TiN film 305 is not covered with the second lower resist layer 310 or the second upper resist layer 312, the TiN film 305 is not removed by the CF-based etching gas and thus remains. In this case, the second p-SiCOH film 304 covered with the TiN film 305 is not removed and remains.

Figure 2F:
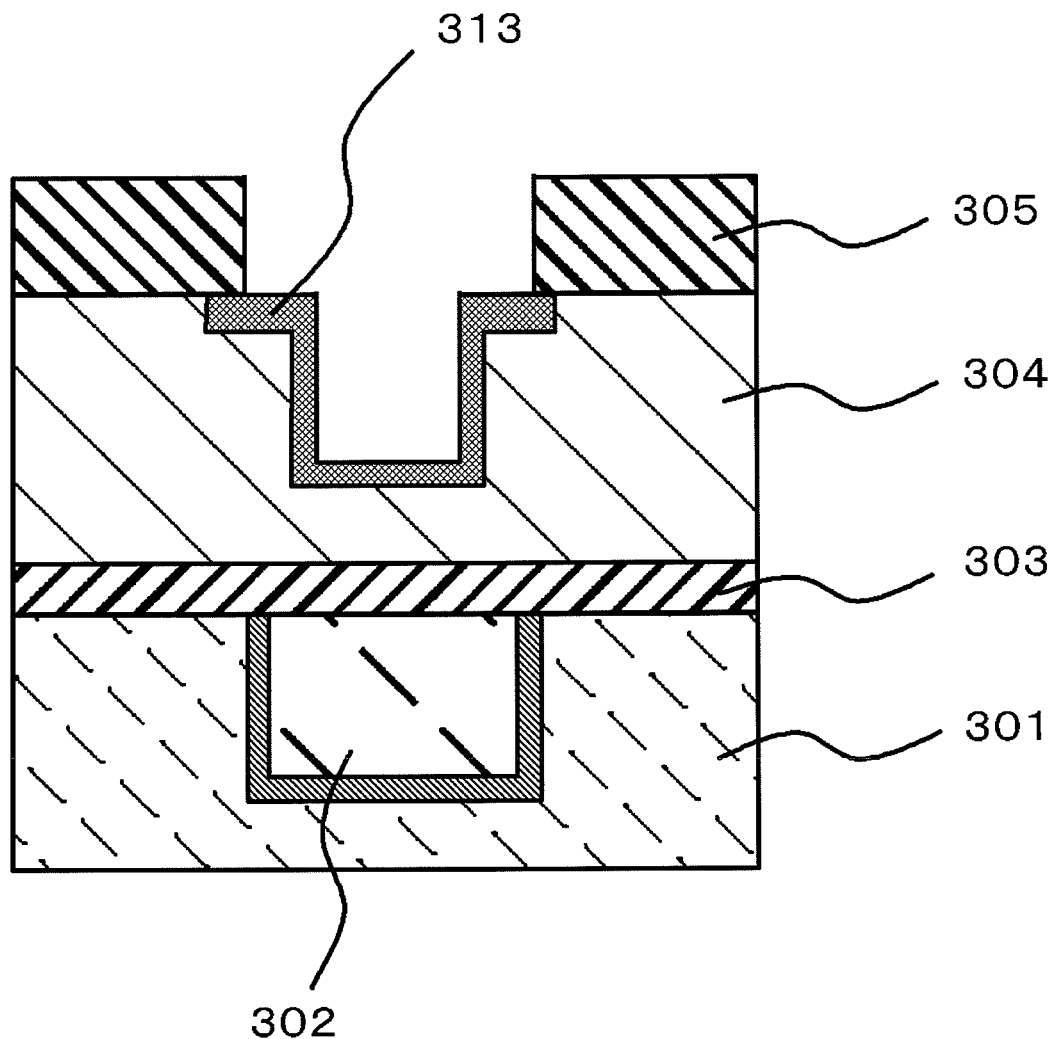

Then, a structure shown in FIG. 2F can be obtained when the remaining second lower resist layer 310 is removed by plasma ashing. At this time, a damaged layer 313 is formed on the bottom surface and the sidewall of the opening formed in the second p-SiCOH film 304.

Figure 2G:
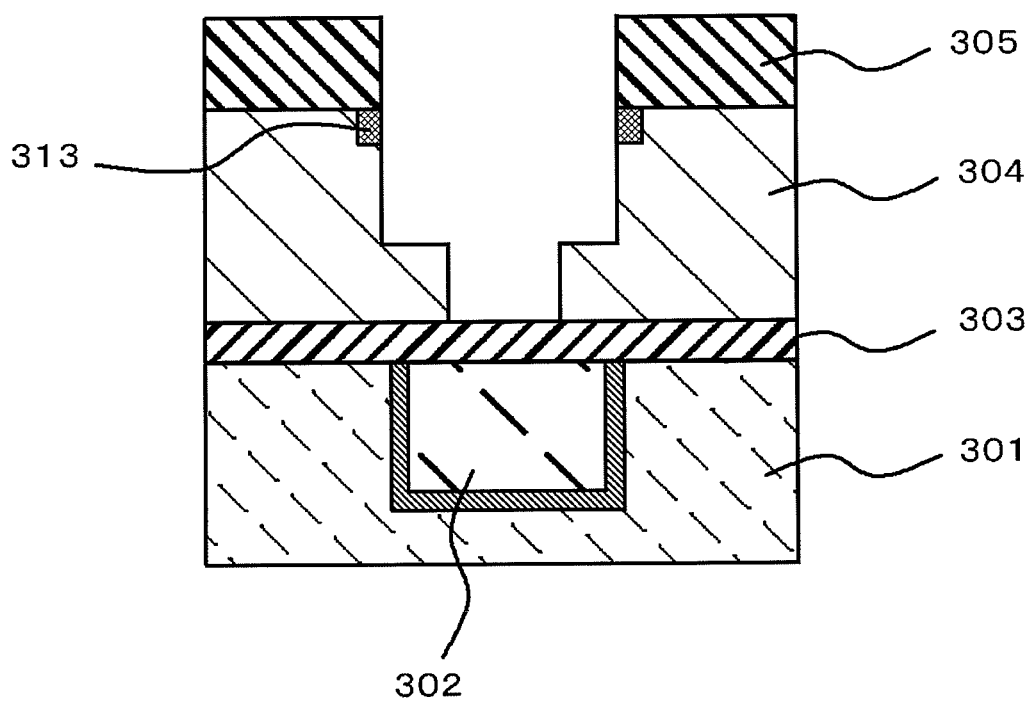
Figure 2H:
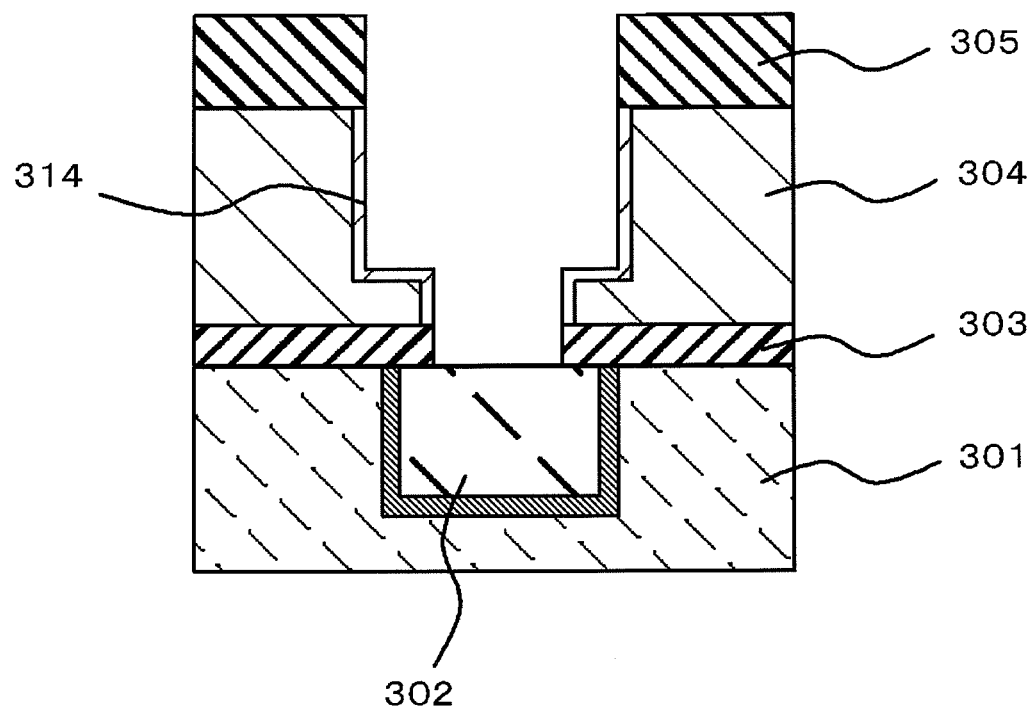
Figure 2I:
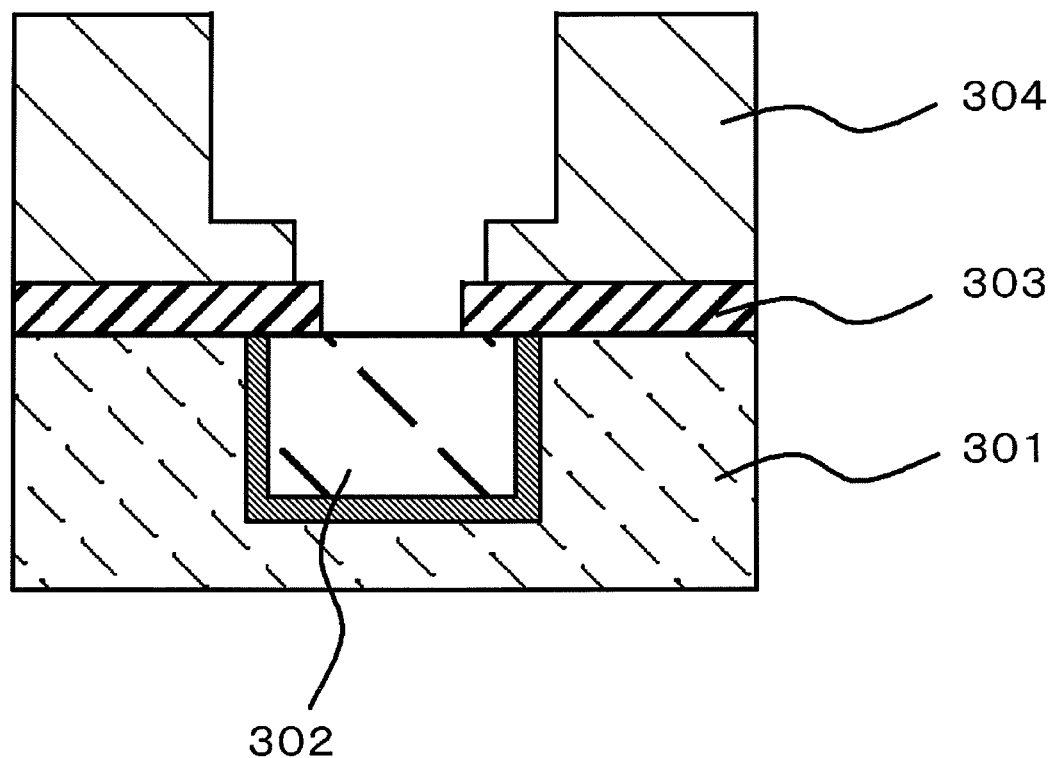

Next, a structure shown in FIG. 2G is obtained when the second p-SiCOH film 304 is treated with the CF-based gas using the TiN film 305 processed in the trench pattern as a mask. Thereafter, as shown in FIG. 2H, the first SiCN film 303 is etched using the second p-SiCOH film 304 as a mask. At this time, a damaged layer 314 is formed on the sidewall of the opening, but is reduced as compared with the first embodiment. The damaged layer 209 (see FIG. 1F) formed on the sidewall of the opening according to the first embodiment is formed when the second lower resist layer 210 remaining after the etching of the trench in FIG. 1E is removed with, for example, an oxygen-containing gas by the plasma ashing.

The damage is the sum of the damage caused by the etching of the trench and the via hole and the damage caused by the plasma ashing of the resist, but the damage caused by the plasma ashing is assumed to be about 80% of the total damage of the damaged layer. On the other hand, since no sacrificial-layer resist remains in the damaged layer 314 (see FIG. 2H) formed on the sidewall of the opening according to this embodiment after the trench etching, it is not necessary to perform the plasma ashing to remove the resist. In addition, the damaged layer on the sidewall of the opening can be reduced because there is only the process damage resulting from the trench etching.

(3) Cleaning Process

After the process of forming the opening, the inside of the opening is cleaned.

That is, the damaged layer 314 on the sidewall of the opening is removed by cleaning of the inside of the opening. As a cleaning liquid used in the cleaning process, a cleaning liquid, such as DHF or buffered-HF (BHF), containing hydrofluoric acid therein can be used. Besides, sulfuric acid or hydrochloric acid may be used as the cleaning liquid. When any one of the above cleaning liquids is selected, the damaged layer 314 can be sufficiently removed and the dielectric constant does not increase.

Hereinafter, the exemplary processing after the cleaning process will be described.

For example, the TiN film 305 is removed using a cleaning liquid containing DHF by performing a wet etching process for a long period of time. A structure shown in FIG. 2I can be obtained by performing the cleaning process and the process of removing the TiN film 305.

Figure 2K:
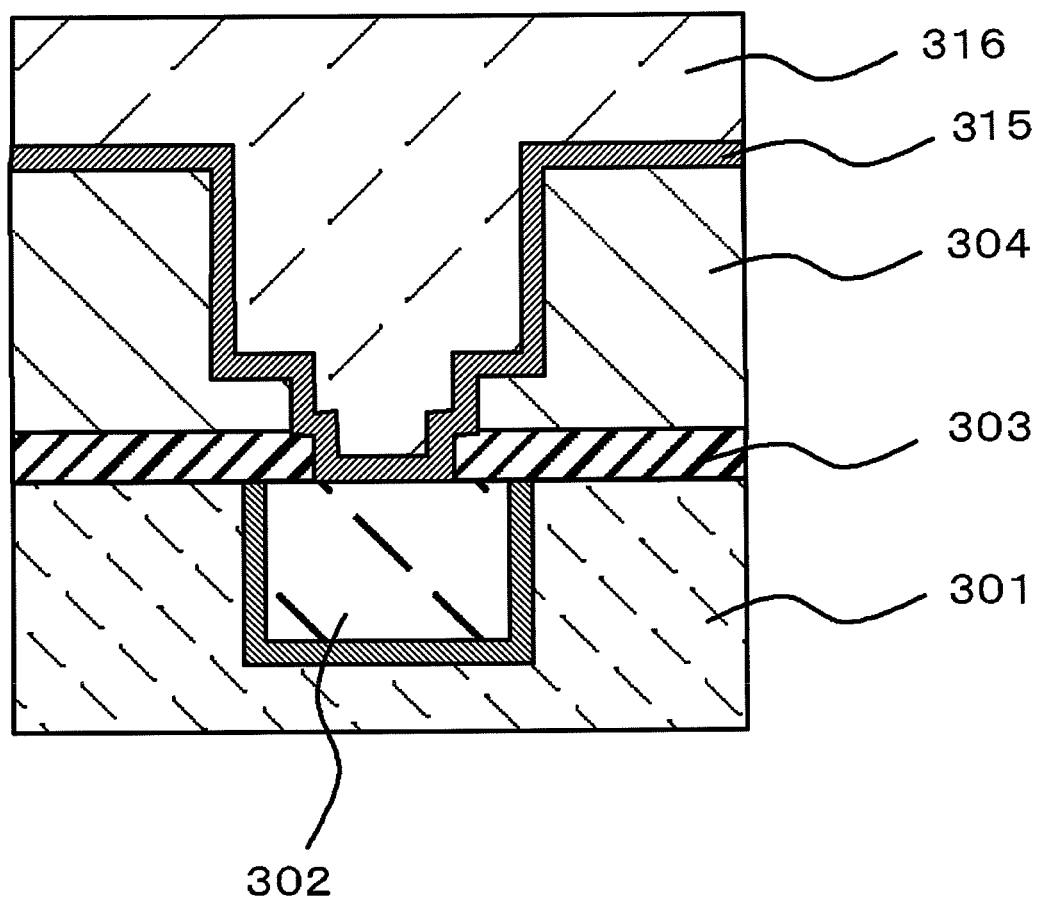
Figure 2L:
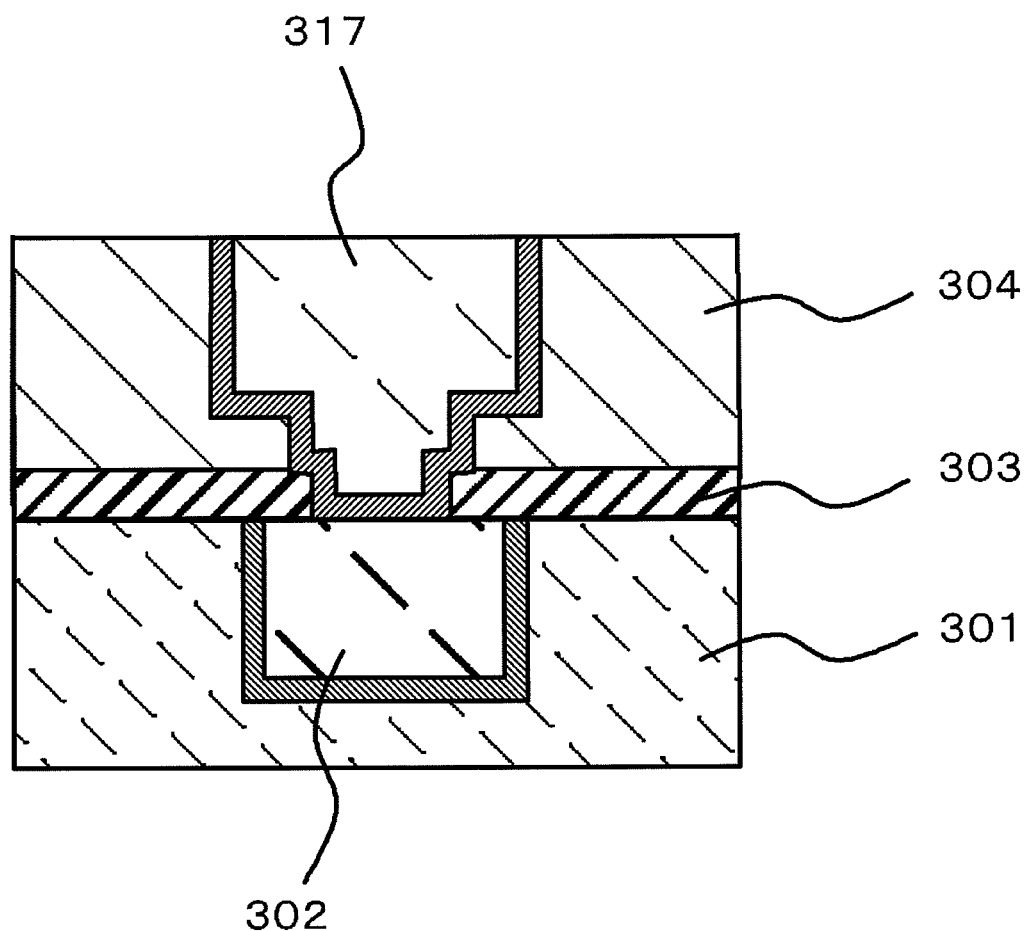

For example, as shown in FIG. 2J, the Ta (upper layer)/TaN (lower layer) (for example, with a total film thickness of 15 nm) as a barrier metal 315 is then formed by a sputtering method. Next, as shown in FIG. 2K, a Cu film 316 is formed by sputtering Cu seed (for example, with a film thickness of 40 nm) on the barrier metal 315 and then forming a Cu-plated film (for example, with a film thickness of 300 nm) by a plating method. Then, for example, heat treatment is performed at 300° C. for 30 minutes under in a nitrogen atmosphere. Next, a structure shown in FIG. 2L can be obtained after a CMP process is performed.

Figure 2M:
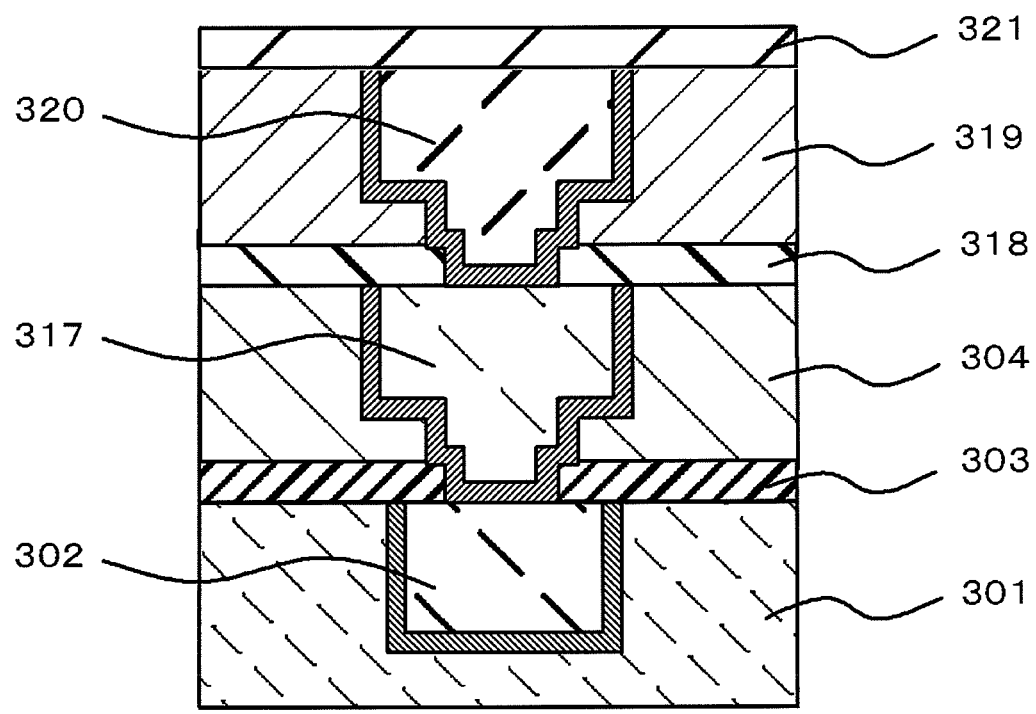
Figure 3A:
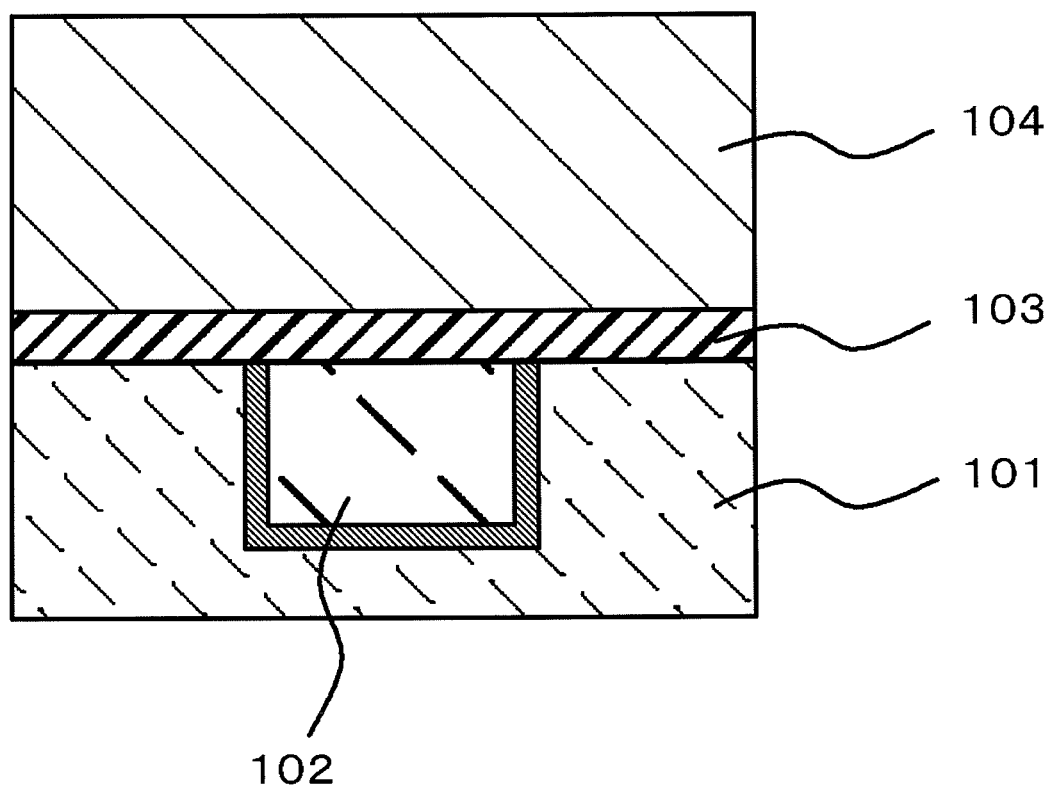
FIGS. 3A to 3L are sectional views schematically showing a manufacturing process of an exemplary method of manufacturing a semiconductor device.
Figure 3B:
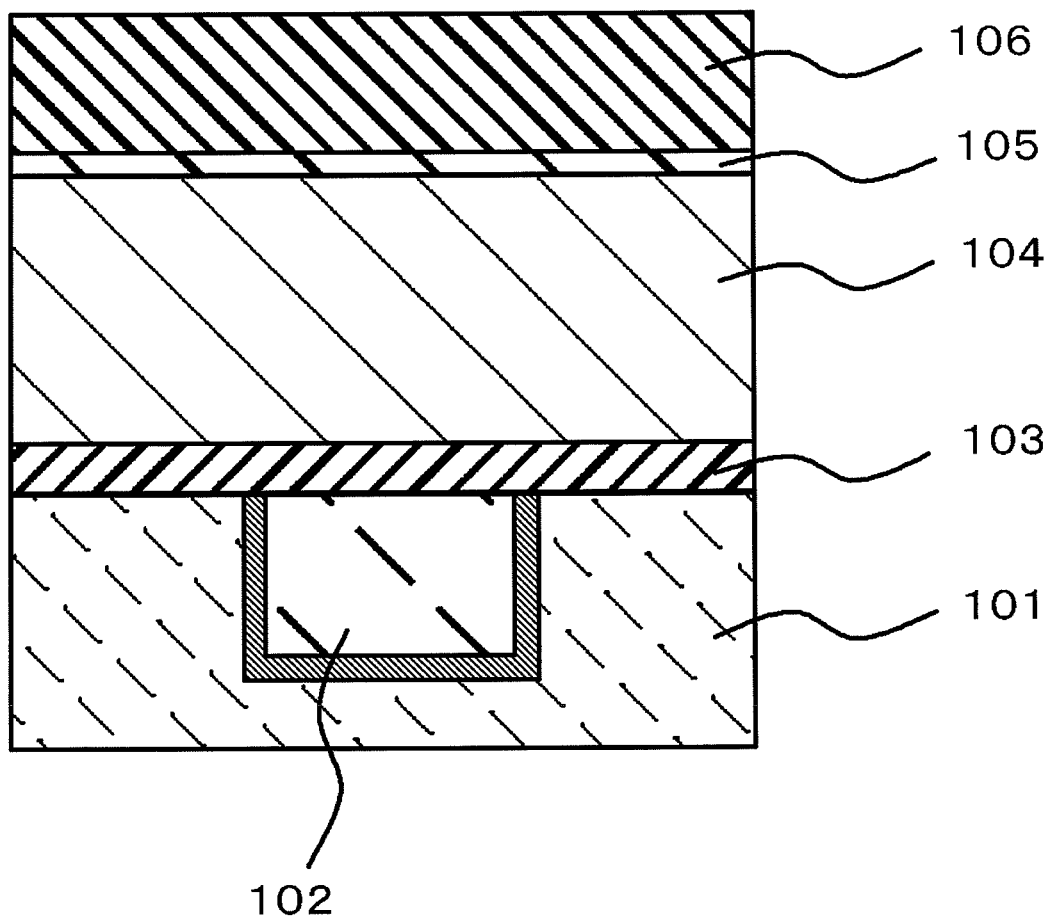
Figure 3C:
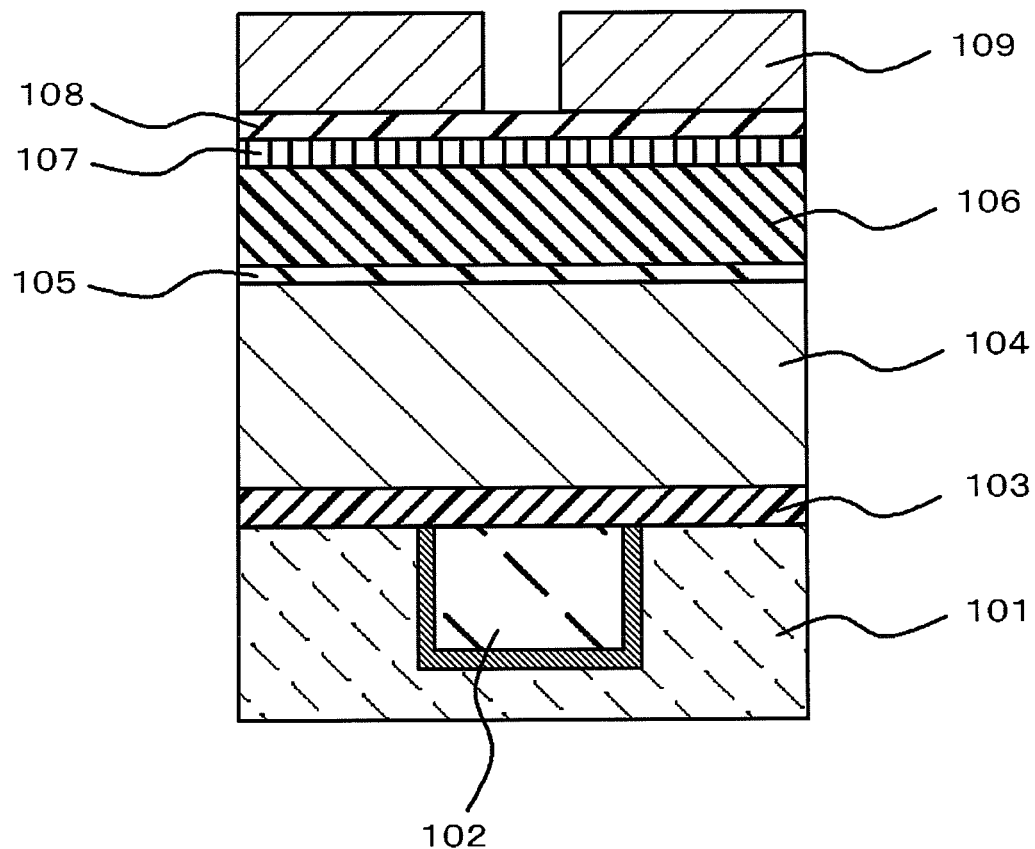
Figure 3D:
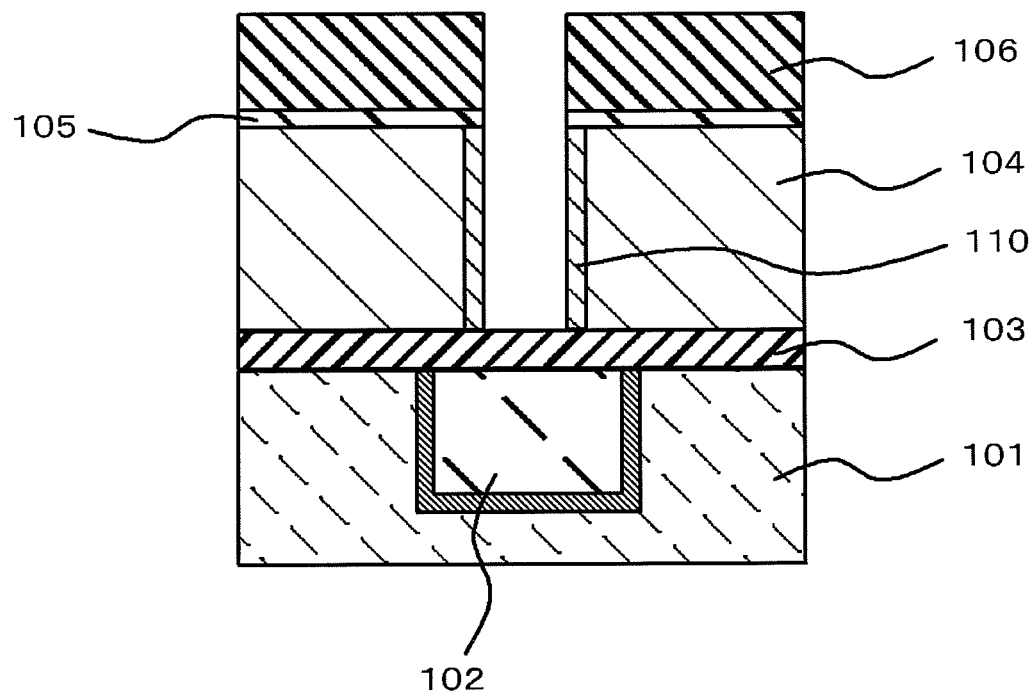
Figure 3E:
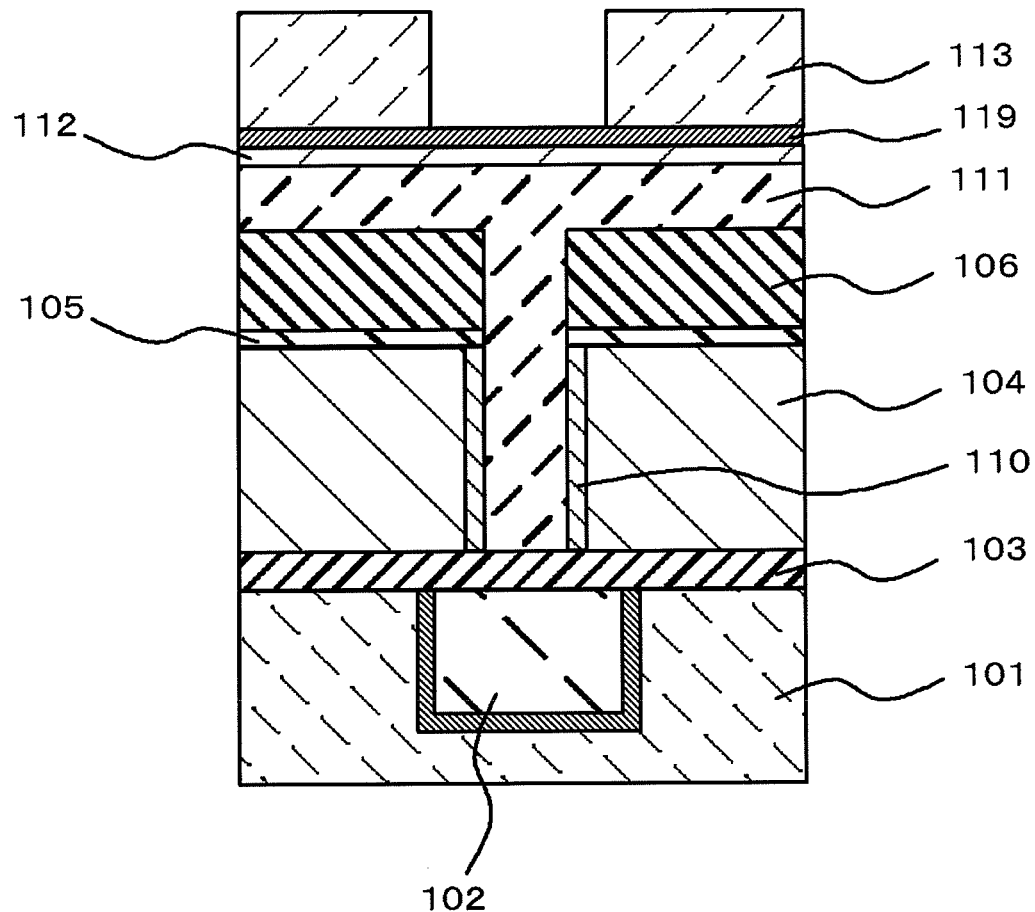
Figure 3F:
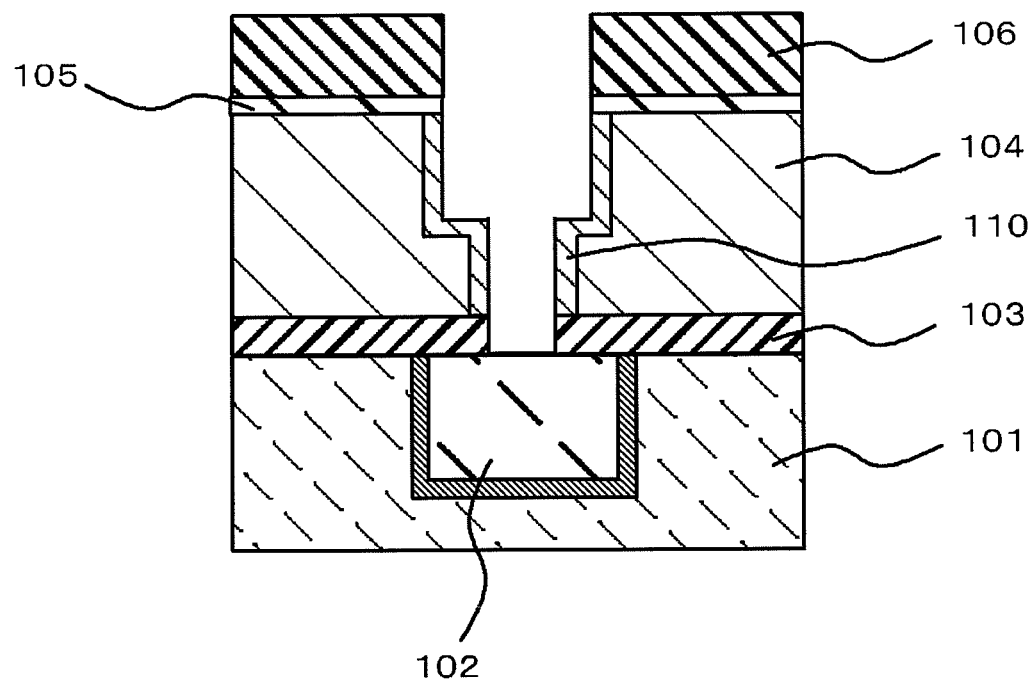
Figure 3G:
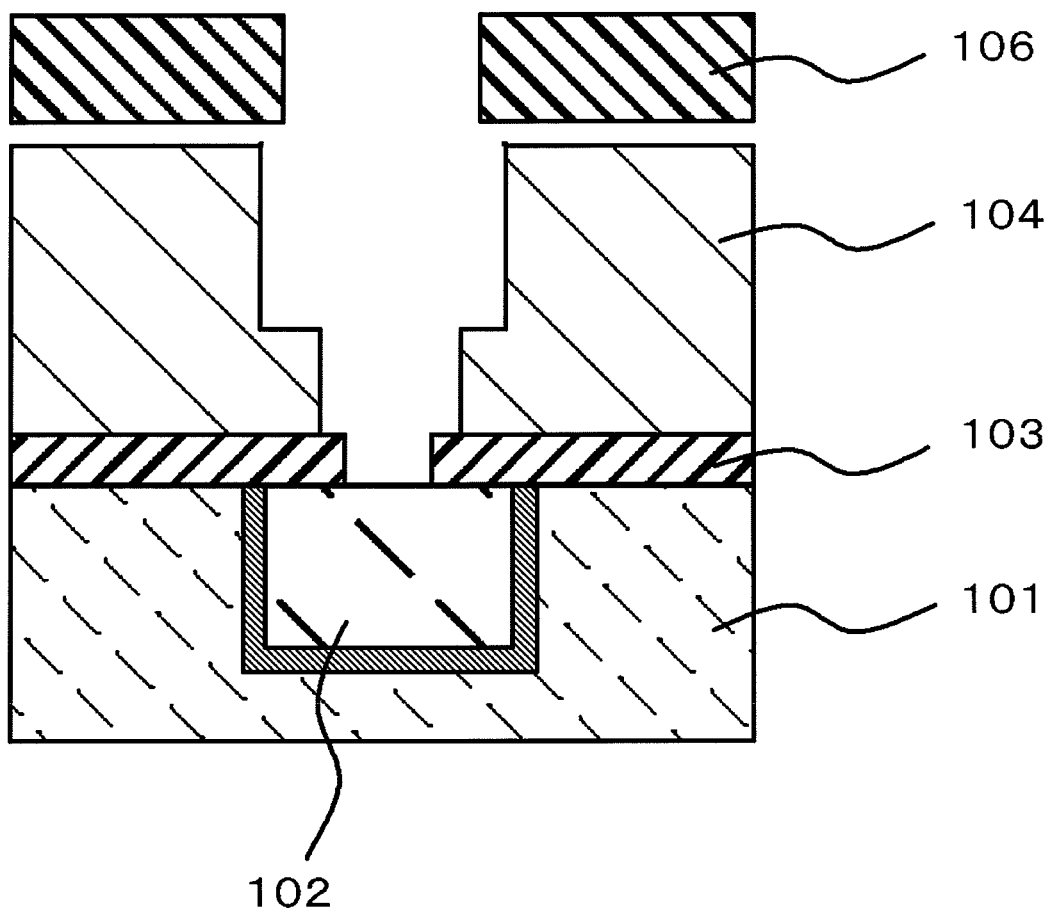
Figure 3H:
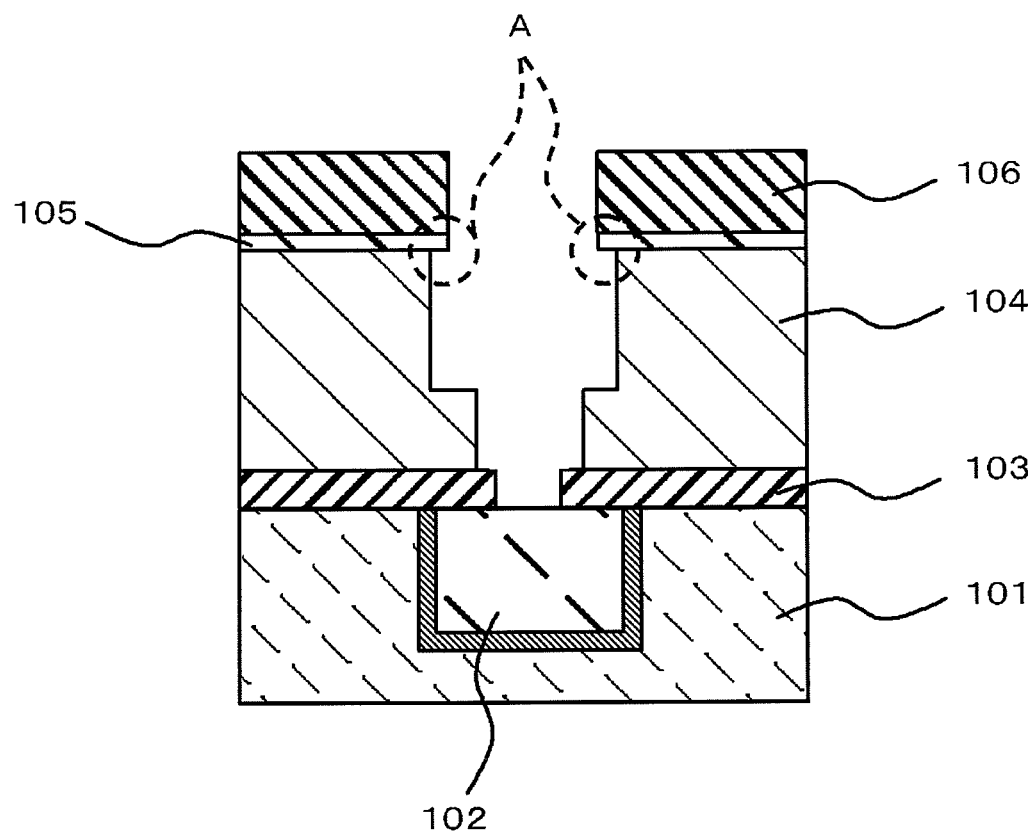
Figure 3I:
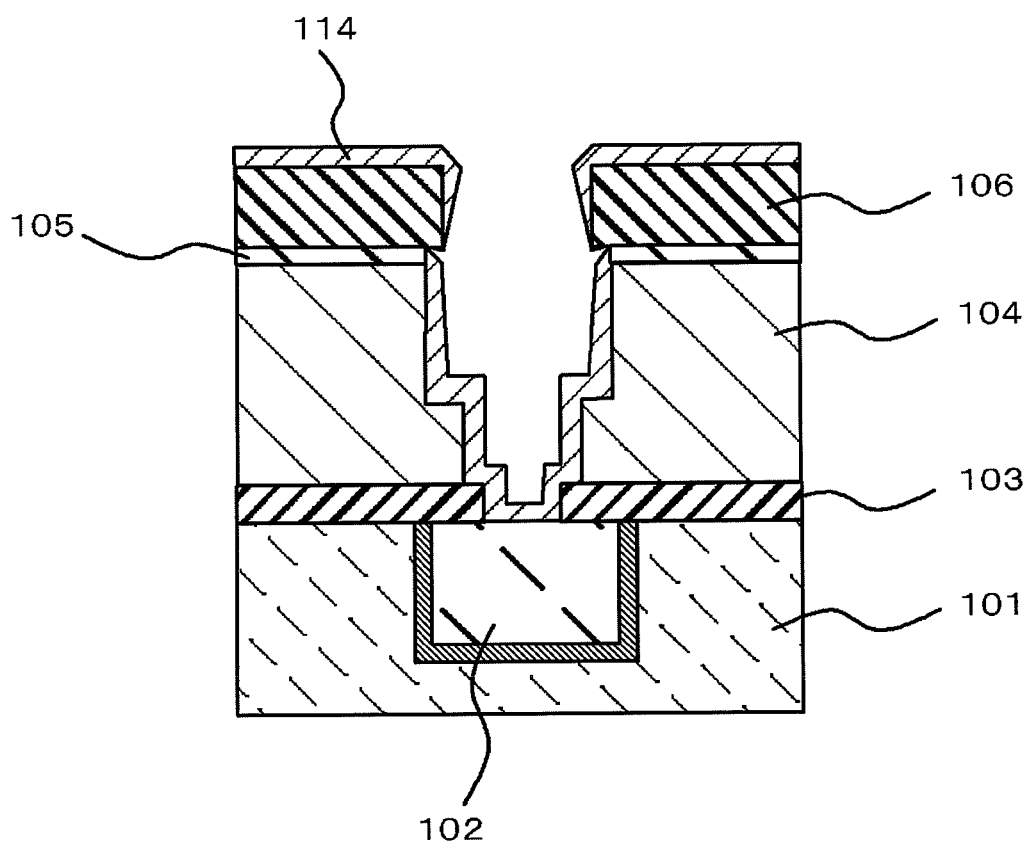
Figure 3J:
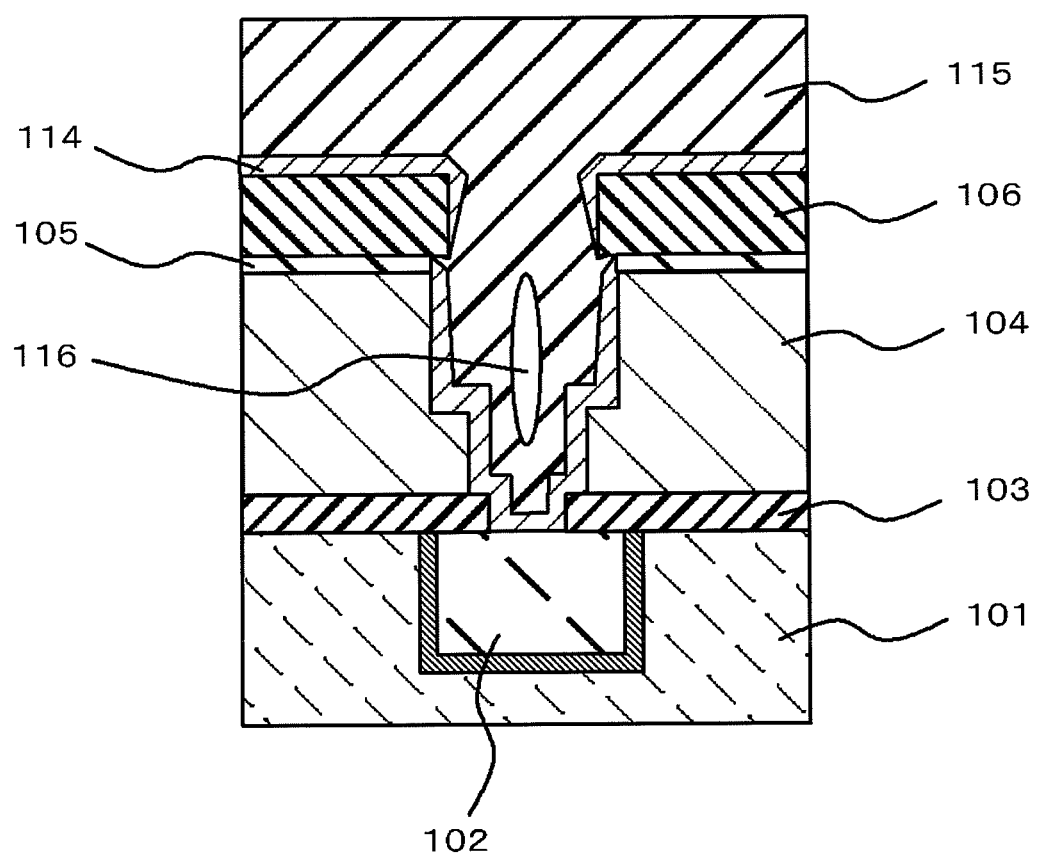
Figure 3K:
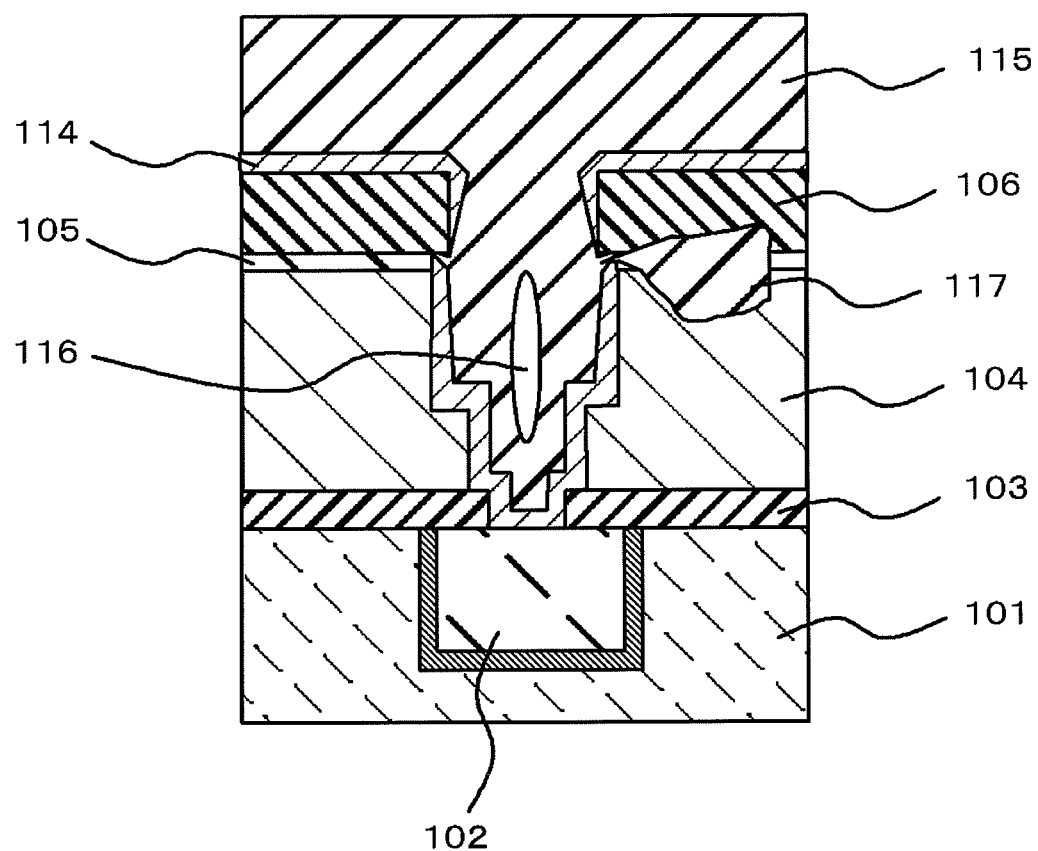
Figure 3L:
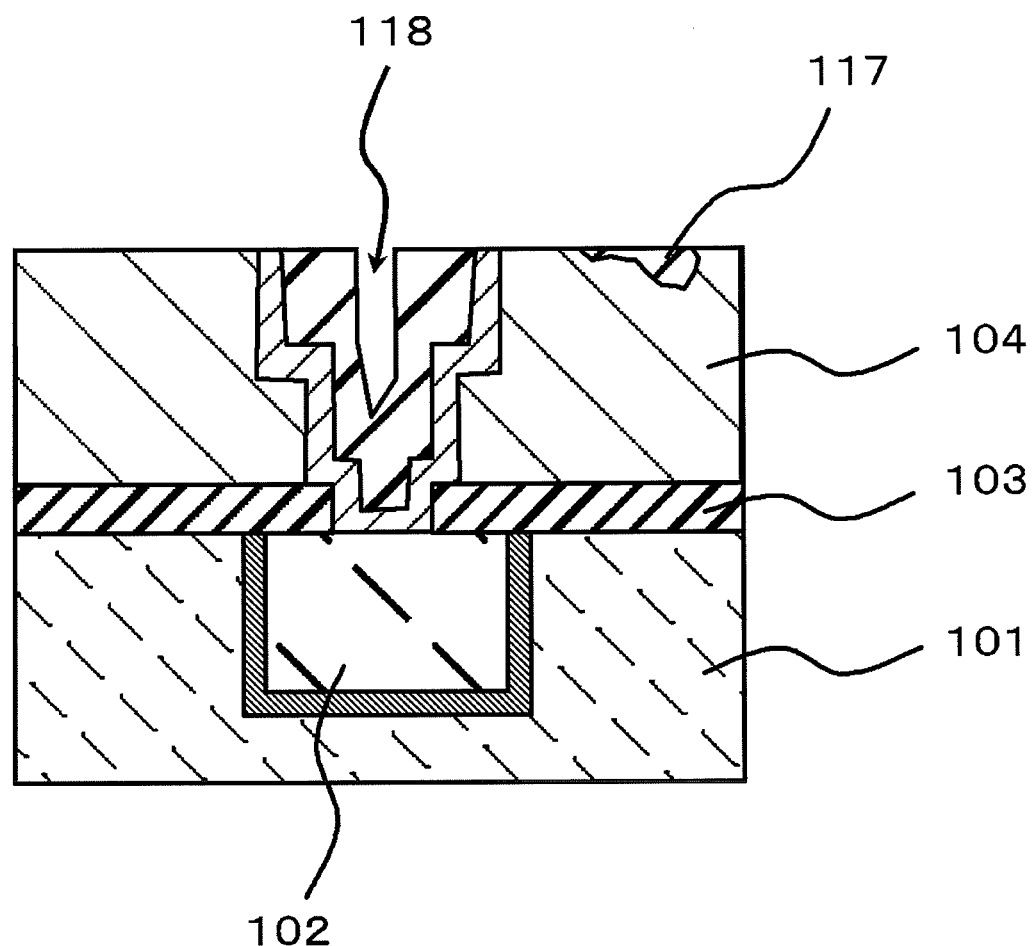

By repeating the above-described processes, a laminate structure shown in FIG. 2M may be formed. The laminate structure with the number of layers equal to or more than that shown in FIG. 2M may be formed.

In the method of manufacturing the semiconductor device according to this embodiment hitherto described, it is possible to obtain the same operational advantages as those of the first embodiment. Moreover, it is possible to obtain an advantage that the CD shift amount is small as compared with the method of manufacturing the semiconductor device according to the first embodiment, since the damaged layer is not nearly formed on the sidewall of the opening formed in the low dielectric constant insulating film.

It is apparent that the present invention is not limited to the above embodiment, and may be modified and changed without departing from the scope and spirit of the invention.

What is claimed is:

1. A method of manufacturing a semiconductor device, comprising:
    forming a first metal film or a silicon film as a hard mask directly on a low dielectric constant insulating film having a lower dielectric constant than that of a silicon oxide formed on an etching stopper film which is on a substrate;
    forming a patterned resist layer directly on said hard mask;
    forming an opening passing through said hard mask and said low dielectric constant insulating film by photolithography and etching after forming said patterned resist layer;
    removing said patterned resist layer by plasma ashing after forming said opening, said plasma ashing causing a damaged layer to be formed on a sidewall of an inside of said opening;
    dry etching an exposed surface of said etching stopper film serving as a bottom surface of said opening;
    cleaning the inside of said opening by wet etching, after said dry etching;
    removing said hard mask after said cleaning the inside; and
    forming a second metal film to fill said opening directly on said low dielectric constant insulating film after said removing the hard mask,
    wherein said cleaning the inside of said opening by said wet etching is performed in a condition that an etching rate of said damaged layer is higher than that of said hard mask,
    wherein said damaged layer formed on the sidewall of the inside of the opening is removed and at least one step portion between said hard mask and said low dielectric insulating film is formed by the cleaning the inside of said opening.

2. The method of manufacturing a semiconductor device as set forth in claim 1,
    wherein said first metal film is made of one of Ti, TiN, W, WN, WSi, Al, AlN, Ta, TaN, Ru, RuN, Co, CoN, Si, Cr, and CrN.

3. The method of manufacturing a semiconductor device as set forth in claim 1,
    wherein said low dielectric constant insulating film is a porous insulating film.

4. The method of manufacturing a semiconductor device as set forth in claim 1,
    wherein said low dielectric constant insulating film is one of SiCOH, HSQ, MSQ, and an organic polymer.

5. The method of manufacturing a semiconductor device as set forth in claim 1,
    wherein said cleaning the inside is performed by said wet etching using a cleaning liquid.

6. The method of manufacturing a semiconductor device as set forth in claim 5,
    wherein said cleaning liquid of said wet etching is one of hydrofluoric acid, sulfuric acid, or hydrochloric acid.

7. The method of manufacturing a semiconductor device as set forth in claim 1,
    wherein said photolithography is performed on a trench pattern through a multi-layered resist method.

8. The method of manufacturing a semiconductor device as set forth in claim 1,
    wherein a barrier metal layer is formed on said low dielectric constant insulating film, the barrier metal layer has an upper layer comprising Ta and a lower layer comprising TaN.

9. The method of manufacturing a semiconductor device as set forth in claim 8,
    wherein said barrier metal layer has a total film thickness of about 15 nm.

10. The method of manufacturing a semiconductor device as set forth in claim 1,
    wherein said second metal film is a Cu wiring.

11. The method of manufacturing a semiconductor device as set forth in claim 1, further comprising:
    forming another resist layer on said hard mask after the damaged layer is formed.

12. The method of manufacturing a semiconductor device as set forth in claim 11, further comprising:
 removing said another resist layer, and
 etching said low dielectric constant insulating film up to half of a depth of said low dielectric constant insulating film when said another resist layer is removed.

* * * * *

UNITED STATES PATENT AND TRADEMARK OFFICE
CERTIFICATE OF CORRECTION

PATENT NO.        : 8,748,314 B2          Page 1 of 1
APPLICATION NO.   : 13/013433
DATED             : June 10, 2014
INVENTOR(S)       : Tatsuya Usami It is certified that error appears in the above-identified patent and that said Letters Patent is hereby corrected as shown below:

In the Specification

Column 1, Line 53: Delete "plasma asking" and insert -- plasma ashing --

Column 5, Line 47: Delete "plasma asking" and insert -- plasma ashing --

Column 8, Line 23: Delete "plasma asking." and insert -- plasma ashing. --

Signed and Sealed this
Thirteenth Day of January, 2015

Michelle K. Lee
*Deputy Director of the United States Patent and Trademark Office*